United States Patent
Henke et al.

(10) Patent No.: US 11,348,742 B2
(45) Date of Patent: May 31, 2022

(54) WET/DRY CONTACT SEQUENCER

(71) Applicant: Arc Suppression Technologies, Bloomington, MN (US)

(72) Inventors: Reinhold Henke, Alexandria, MN (US); Robert Thorbus, Chanhassen, MN (US)

(73) Assignee: Arc Suppression Technologies, Bloomington, MN (US)

( * ) Notice: Subject to any disclaimer, the term of this patent is extended or adjusted under 35 U.S.C. 154(b) by 0 days.

(21) Appl. No.: 16/909,081

(22) Filed: Jun. 23, 2020

(65) Prior Publication Data

US 2020/0357580 A1 Nov. 12, 2020

Related U.S. Application Data

(63) Continuation of application No. 16/776,106, filed on Jan. 29, 2020, now Pat. No. 10,727,005.

(Continued)

(51) Int. Cl.
*H01H 1/00* (2006.01)
*G01R 31/27* (2006.01)
(Continued)

(52) U.S. Cl.
CPC ....... *H01H 1/0015* (2013.01); *G01R 31/3277* (2013.01); *G01R 31/3278* (2013.01);
(Continued)

(58) Field of Classification Search
CPC .... H01H 1/0015; H01H 50/045; G01R 31/27; G01R 31/32; G01R 31/3277; G06F 19/00
See application file for complete search history.

(56) References Cited

U.S. PATENT DOCUMENTS 4,420,784 A * 12/1983 Chen .................. H01H 9/30
361/13
5,420,571 A 5/1995 Coleman et al.
(Continued)

FOREIGN PATENT DOCUMENTS

DE 4427006 2/1996
DE 19711622.1 7/1998
(Continued)

OTHER PUBLICATIONS

"U.S. Appl. No. 16/776,106, Notice of Allowance dated Apr. 13, 2020", 12 pgs.
(Continued)

*Primary Examiner* — Neel D Shah
(74) *Attorney, Agent, or Firm* — Schwegman Lundberg & Woessner, P.A.

(57) ABSTRACT

Device, circuit, system, and method for contact sequencing are discussed. An electrical circuit includes a first pair of terminals adapted to be connected across a first set of switchable contacts, and a second pair of terminals adapted to be connected across a second set of switchable contacts that are coupled to an arc suppression circuit. A controller circuit is coupled to the first and second pairs of terminals and is configured to sequence activation or deactivation of the first and second sets of contacts based on a contact control signal. A first power switching circuit is coupled to the first pair of terminals and the controller circuit. The first power switching circuit is configured to switch power from an external power source and to trigger the activation or the deactivation of the first set of switchable contacts based on a first logic state signal from the controller circuit.

20 Claims, 8 Drawing Sheets

Related U.S. Application Data

(60) Provisional application No. 62/898,783, filed on Sep. 11, 2019, provisional application No. 62/898,780, filed on Sep. 11, 2019, provisional application No. 62/898,787, filed on Sep. 11, 2019, provisional application No. 62/898,795, filed on Sep. 11, 2019, provisional application No. 62/898,798, filed on Sep. 11, 2019, provisional application No. 62/798,323, filed on Jan. 29, 2019, provisional application No. 62/798,316, filed on Jan. 29, 2019, provisional application No. 62/798,326, filed on Jan. 29, 2019.

(51) Int. Cl.

| | |
|---|---|
| *H01H 50/04* | (2006.01) |
| *G01R 31/327* | (2006.01) |
| *G01R 31/40* | (2020.01) |
| *H02H 1/00* | (2006.01) |
| *H02H 3/08* | (2006.01) |
| *H01H 9/54* | (2006.01) |
| *H02M 3/156* | (2006.01) |
| *H03K 3/313* | (2006.01) |
| *H03K 17/60* | (2006.01) |
| *H04W 4/60* | (2018.01) |
| *G06F 3/0484* | (2022.01) |
| *G06F 3/04842* | (2022.01) |
| *H04L 67/1095* | (2022.01) |
| *H04L 67/148* | (2022.01) |
| *H01H 1/50* | (2006.01) |
| *H02H 3/06* | (2006.01) |
| *H02H 3/087* | (2006.01) |
| *H02H 7/26* | (2006.01) |
| *H02H 9/02* | (2006.01) |
| *H02H 9/08* | (2006.01) |
| *H03K 3/45* | (2006.01) |
| *H01H 47/00* | (2006.01) |
| *H01H 71/04* | (2006.01) |

(52) U.S. Cl.
CPC .......... *G01R 31/40* (2013.01); *G06F 3/0484* (2013.01); *G06F 3/04842* (2013.01); *H01H 9/547* (2013.01); *H01H 50/045* (2013.01); *H02H 1/0007* (2013.01); *H02H 3/08* (2013.01); *H02M 3/156* (2013.01); *H03K 3/313* (2013.01); *H03K 17/601* (2013.01); *H04L 67/1095* (2013.01); *H04L 67/148* (2013.01); *H04W 4/60* (2018.02); *H01H 9/54* (2013.01); *H01H 2001/506* (2013.01); *H01H 2047/008* (2013.01); *H01H 2071/044* (2013.01); *H02H 3/06* (2013.01); *H02H 3/087* (2013.01); *H02H 7/26* (2013.01); *H02H 9/02* (2013.01); *H02H 9/08* (2013.01); *H03K 3/45* (2013.01)

(56) References Cited

U.S. PATENT DOCUMENTS

| | | | |
|---|---|---|---|
| 7,705,601 | B2 | 4/2010 | Zhou et al. |
| 10,727,005 | B1 | 7/2020 | Henke et al. |
| 2002/0118495 | A1 | 8/2002 | Beckert et al. |
| 2010/0153022 | A1 | 6/2010 | Chen et al. |
| 2011/0241692 | A1 | 10/2011 | Akita et al. |
| 2012/0123698 | A1 | 5/2012 | Chen et al. |
| 2013/0187389 | A1 | 7/2013 | Thangamani et al. |
| 2014/0091059 | A1 | 4/2014 | Henke |
| 2020/0243268 | A1 | 7/2020 | Henke et al. |

FOREIGN PATENT DOCUMENTS

| | | |
|---|---|---|
| WO | 2015197471 | 12/2015 |
| WO | WO-2021050455 A1 | 3/2021 |
| WO | WO-2021050459 A1 | 3/2021 |
| WO | WO-2021050460 A1 | 3/2021 |
| WO | WO-2021050461 A1 | 3/2021 |
| WO | WO-2021050830 A1 | 3/2021 |

OTHER PUBLICATIONS

"International Application Serial No. PCT US2020 049813, International Search Report dated Nov. 27, 2020", 3 pgs.

"International Application Serial No. PCT US2020 049813, Written Opinion dated Nov. 27, 2020", 7 pgs.

"International Application Serial No. PCT US2020 049814, International Search Report dated Nov. 30, 2020", 3 pgs.

"International Application Serial No. PCT US2020 049814, Written Opinion dated Nov. 30, 2020", 8 pgs.

"International Application Serial No. PCT US2020 049807, Invitation to Pay Additional Fees mailed Dec. 1, 2020", 18 pgs.

"International Application Serial No. PCT US2020 049812, International Search Report dated Dec. 4, 2020", 3 pgs.

"International Application Serial No. PCT US2020 049812, Written Opinion dated Dec. 4, 2020", 9 pgs.

"International Application Serial No. PCT US2020 050336, International Search Report dated Dec. 18, 2020", 4 pgs.

"International Application Serial No. PCT US2020 050336, Written Opinion dated Dec. 18, 2020", 5 pgs.

"International Application Serial No. PCT US2020 050336, International Search Report dated Dec. 4, 2020", 3 pgs.

"International Application Serial No. PCT US2020 050336, Written Opinion dated Dec. 4, 2020", 5 pgs.

"International Application Serial No. PCT US2020 049807, International Search Report dated Feb. 1, 2021", 7 pgs.

"International Application Serial No. PCT US2020 049807, Written Opinion dated Feb. 1, 2021", 14 pgs.

U.S. Appl. No. 16/776,106, U.S. Pat. No. 10,727,005, filed Jan. 29, 2020, Wet/Dry Contract Sequencer.

"International Application Serial No. PCT US2020 049807, International Preliminary Report on Patentability dated Mar. 24, 2022", 16 pgs.

"International Application Serial No. PCT US2020 049812, International Preliminary Report on Patentability dated Mar. 24, 2022", 11 pgs.

"International Application Serial No. PCT US2020 049813, International Preliminary Report on Patentability dated Mar. 24, 2022", 9 pgs.

"International Application Serial No. PCT US2020 049814, International Preliminary Report on Patentability dated Mar. 24, 2022", 10 pgs.

"International Application Serial No. PCT US2020 050336, International Preliminary Report on Patentability dated Mar. 24, 2022", 7 pgs.

\* cited by examiner

WET/DRY CONTACT SEQUENCER

PRIORITY

This application is a continuation of U.S. patent application Ser. No. 16/776,106, filed Jan. 29, 2020, which application claims the benefit of priority to U.S. Provisional Application Ser. No. 62/798,316, filed Jan. 29, 2019; U.S. Provisional Application Ser. No. 62/798,323, filed Jan. 29, 2019; U.S. Provisional Application Ser. No. 62/798,326, filed Jan. 29, 2019 U.S. Provisional Application Ser. No. 62/898,780, filed Sep. 11, 2019. U.S. Provisional Application Ser. No. 62/898,783, filed Sep. 11, 2019, U.S. Provisional Application Ser. No. 62/898,787, filed Sep. 11, 2019, U.S. Provisional Application Ser. No. 62/898,795, filed Sep. 11, 2019, and U.S. Provisional Application Ser. No. 62/898,798, filed Sep. 11, 2019, the contents of all which are incorporated herein by reference in their entireties.

TECHNICAL FIELD

The present application relates generally to electrical contact sequencing, to control the ON/OFF timing sequence of electrical contacts connected in parallel or in series with each other.

BACKGROUND

Product designers, technicians, and engineers are trained to accept manufacturer specifications when selecting electromechanical relays and contactors. None of these specifications, however, indicate the serious impact of electrical contact arcing on the life expectancy of the relay or the contactor. This is especially true in high-power (e.g., over 2 Amp) applications.

Electrical current contact arcing may have a deleterious effect on electrical contact surfaces, such as relays and certain switches. Arcing may degrade and ultimately destroy the contact surface over time and may result in premature component failure, lower quality performance, and relatively frequent preventative maintenance needs. Additionally, arcing in relays, switches, and the like may result in the generation of electromagnetic interference (EMI) emissions. Electrical current contact arcing may occur both in alternating current (AC) power and in direct current (DC) power across the fields of consumer, commercial, industrial, automotive, and military applications. Because of its prevalence, there have literally been hundreds of specific means developed to address the issue of electrical current contact arcing.

SUMMARY

Various examples are now described to introduce a selection of concepts in a simplified form that is further described below in the detailed description. The Summary is not intended to identify key or essential features of the claimed subject matter, nor is it intended to be used to limit the scope of the claimed subject matter.

According to a first aspect of the present disclosure, there is provided an electrical circuit that includes a first pair of terminals adapted to be connected across a first set of switchable contacts and a second pair of terminals adapted to be connected across a second set of switchable contacts. The second set of switchable contacts is coupled to an arc suppression circuit. A controller circuit is operatively coupled to the first and second pairs of terminals. The controller circuit is configured to sequence activation or deactivation of the first set of switchable contacts and the second set of switchable contacts based on a contact control signal. During the activation, the first set of switchable contacts is activated prior to activation of the second set of switchable contacts. During the deactivation, the second set of switchable contacts is deactivated prior to deactivation of the first set of switchable contacts. A first power switching circuit is operatively coupled to the first pair of terminals and the controller circuit. The first power switching circuit is configured to switch power from an external power source and to trigger the activation or the deactivation of the first set of switchable contacts based on a first logic state signal from the controller circuit.

According to a second aspect of the present disclosure, there is provided a system including a first relay circuit with a first relay coil and a first set of switchable contacts, and a second relay circuit with a second relay coil and a second set of switchable contacts. The system further includes an arc suppression circuit coupled to the second set of switchable contacts. The system further includes a coil driver termination circuit configured to receive a signal indicative of the energization status of the first set of switchable contacts and the second set of switchable contacts. A controller circuit is operatively coupled to the coil driver termination circuit, the first relay circuit, and the second relay circuit. The controller circuit is configured to sequence activation or deactivation of the first set of switchable contacts and the second set of switchable contacts based on the signal indicative of energization status. The controller circuit is further configured to sequence the activation or the deactivation while the second set of switchable contacts is protected by the arc suppression circuit.

According to a third aspect of the present disclosure, there is provided a method including coupling a signal converter circuit to a pair of terminals. The signal converter circuit is configured to convert a signal indicative of the energization status of a first set of switchable contacts and a second set of switchable contacts into a logic level control signal, the signal received from a driver circuit via the pair of terminals. The method further includes coupling a controller circuit to a first set of switchable contacts and a second set of switchable contacts. The controller circuit is configured to sequence activation or deactivation of the first set of switchable contacts and the second set of switchable contacts based on the logic level control signal. The method further includes coupling a first current sensor to the first set of switchable contacts and the controller circuit. The first current sensor is configured to generate a first sensed current signal associated with detected current across the first set of switchable contacts. The method further includes coupling a second current sensor to the second set of switchable contacts and the controller circuit. The second current sensor is configured to generate a second sensed current signal associated with detected current across the second set of switchable contacts. The method further includes coupling a status indicator to the controller circuit, the status indicator configured to provide an indication of a fault based on a fault detection signal from the controller circuit. The fault detection signal may be generated based on the first sensed current signal and the second sensed current signal.

Any one of the foregoing examples may be combined with any one or more of the other foregoing examples to create a new embodiment within the scope of the present disclosure.

BRIEF DESCRIPTION OF THE DRAWINGS

In the drawings, which are not necessarily drawn to scale, like numerals may describe similar components in different views. The drawings illustrate generally, by way of example, but not by way of limitation, various embodiments discussed in the present document.

DETAILED DESCRIPTION

Figure 1:
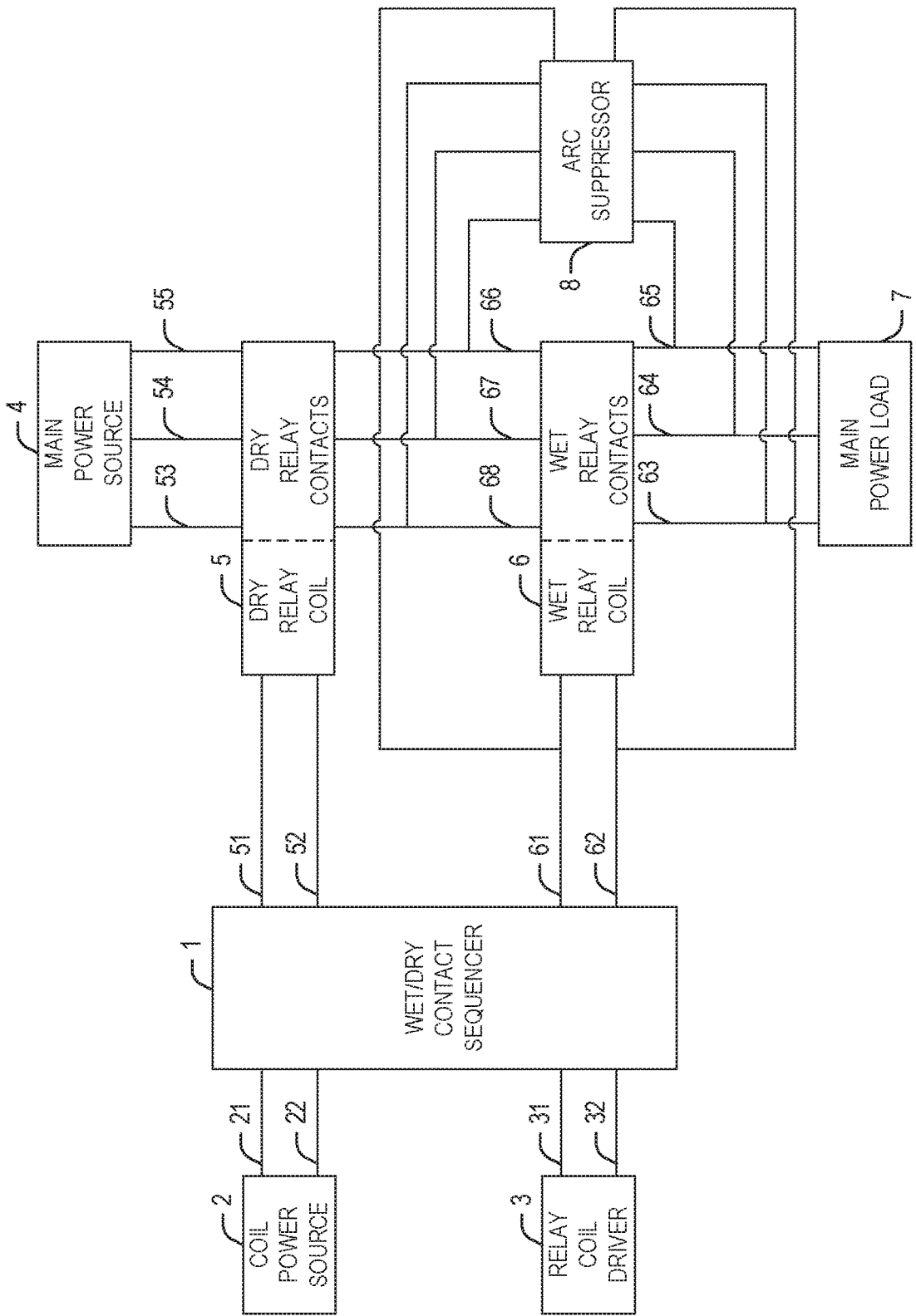
FIG. 1 is a diagram of a system including a wet/dry contact sequencer and an arc suppressor, according to some embodiments.

It should be understood at the outset that although an illustrative implementation of one or more embodiments is provided below, the disclosed systems, methods, and/or apparatuses described with respect to FIGS. 1-6 may be implemented using any number of techniques, whether currently known or not yet in existence. The disclosure should in no way be limited to the illustrative implementations, drawings, and techniques illustrated below, including the exemplary designs and implementations illustrated and described herein, but may be modified within the scope of the appended claims along with their full scope of equivalents.

In the following description, reference is made to the accompanying drawings that form a part hereof, and in which are shown, by way of illustration, specific embodiments which may be practiced. These embodiments are described in sufficient detail to enable those skilled in the art to practice the inventive subject matter, and it is to be understood that other embodiments may be utilized, and that structural, logical, and electrical changes may be made without departing from the scope of the present disclosure. The following description of example embodiments is, therefore, not to be taken in a limiting sense, and the scope of the present disclosure is defined by the appended claims.

As used herein, the term "dry contact" (e.g., as used in connection with an interlock such as a relay or contactor) refers to a contact that is only carrying load current when closed. Such contact may not switch the load and may not make or break under load current. As used herein, the term "wet contact" (e.g., as used in connection with an interlock such as a relay or contactor) refers to a contact carrying load current when closed as well as switching load current during the make and break transitions.

The purpose of an interlock is to prevent undesired states in a device or system, especially those states that create unsafe operating conditions for users and/or operating personnel. In most applications, interlocks are either relays or contactors. Because it is a safety mechanism, the interlock has to be configured to operate reliably. Techniques disclosed herein may be used in connection with high power interlock applications that have low cycle times, high dielectric isolation, and low leakage current, such as power disconnect applications, battery disconnect applications, emergency disconnect applications, safety disconnect applications, full load current disconnect applications, etc. The importance of interlock has lead product designers, technicians, and engineers to conventionally employ heavy duty contactors to both carry the operational work load and act as the safety shut-off. Unfortunately, contact current arcing causes significant deterioration of the contacts during normal operation. This deterioration can cause the contacts to fail in a safety situation.

Techniques disclosed herein relate to the design and configuration of a wet/dry contact sequencer to ensure better interlock performance during normal operation while guaranteeing the successful operation of safety shut-off switches. An optimal way to address the shortcomings of a single contactor is to replace it with dual contactors or relays—a "wet" contact switch and a "dry" contact switch. The wet/dry contact sequencer disclosed herein may be used as follows: during turn off, the wet contact breaks first, the dry contact breaks last (keeping the dry contact free of load current); and during turn on, the dry contact makes first, the wet contact makes last (keeping the dry contact free of load current). In this regard, the dry contact will provide high dielectric isolation during the open state of the contact as is required for safety interlock operations. The dry contact will remain in nearly pristine contact metal surface conditions because it is not experiencing contact arcing due to its dry switching function only.

In some aspects, the disclosed wet/dry contact sequencer may incorporate an arc suppression circuit (also referred to as an arc suppressor) coupled to the wet contact, to protect the wet contact from arcing during the make and break transitions and to reduce deleterious effects from contact arcing. The arc suppressor incorporated with the wet/dry contact sequencer discussed herein may include an arc suppressor as disclosed in the following issued U.S. patents—U.S. Pat. Nos. 8,619,395 and 9,423,442, both of which are incorporated herein by reference in their entirety.

Examples of wet/dry contact sequencers and components utilized therein and in conjunction with wet/dry contact sequencers are disclosed herein. Examples are presented without limitation and it is to be recognized and understood that the embodiments disclosed are illustrative and that the circuit and system designs described herein may be implemented with any suitable specific components to allow for the circuit and system designs to be utilized in a variety of desired circumstances. Thus, while specific components are disclosed, it is to be recognized and understood that alternative components may be utilized as appropriate.

FIG. 1 is a diagram of a system 100 including a wet/dry contact sequencer and an arc suppressor, according to some embodiments. Referring to FIG. 1, system 100 may include a wet/dry contact sequencer 1 coupled to a dry relay 5, a wet relay 6, a coil power source 2, and the relay coil driver 3. The dry relay 5 may include a dry relay coil coupled to dry relay contacts, and the wet relay 6 may include a wet relay coil coupled to wet relay contacts. The dry relay 5 is coupled to a main power source 4 and is coupled in series with the wet relay 6. The wet relay 6 is coupled to a main power load 7. Additionally, the wet relay 6 is protected by an arc suppressor 8 coupled across the wet relay contacts of the wet relay 6.

The main power source 4 may be an AC power source or a DC power source. Sources four AC power may include generators, alternators, transformers, and the like. Source four AC power may be sinusoidal, non-sinusoidal, or phase controlled. An AC power source may be utilized on a power grid (e.g., utility power, power stations, transmission lines, etc.) as well as off the grid, such as for rail power. Sources for DC power may include various types of power storage, such as batteries, solar cells, fuel cells, capacitor banks, and thermopiles, dynamos, and power supplies. DC power types may include direct, pulsating, variable, and alternating (which may include superimposed AC, full wave rectification, and half wave rectification). DC power may be associated with self-propelled applications, i.e., articles that drive, fly, swim, crawl, dive, internal, dig, cut, etc. Even though FIG. 1 illustrates the main power source 4 as externally provided, the disclosure is not limited in this regard and the main power source may be provided internally, e.g., a battery or another power source. Additionally, the main power source 4 may be a single-phase or a multi-phase power source.

Even though FIG. 1 illustrates the wet/dry contact sequencer 1 coupled to a dry relay 5 and a wet relay 6 that include a relay coil and relay contacts, the disclosure is not limited in this regard and other types of interlock arrangements may be used as well, such as switches, contactors, or other types of interlocks. A contactor may be a specific, heavy duty, high current, embodiment of a relay.

The dry and wet contacts associated with the dry and wet relays in FIG. 1 may each include a pair of contacts, such as electrodes. In some aspects, the main power load 7 may be a general-purpose load, such as consumer lighting, computing devices, data transfer switches, etc. In some aspects, the main power load 7 may be a resistive load, such as a resistor, heater, electroplating device, etc. In some aspects, the main power load 7 may be a capacitive load, such as a capacitor, capacitor bank, power supply, etc. In some aspects, the main power load 7 may be an inductive load, such as an inductor, transformer, solenoid, etc. In some aspects, the main power load 7 may be a motor load, such as a motor, compressor, fan, etc. In some aspects, the main power load 7 may be a tungsten load, such as a tungsten lamp, infrared heater, industrial light, etc. In some aspects, the main power load 7 may be a ballast load, such as a fluorescent light, a neon light, a light emitting diode (LED), etc. In some aspects, the main power load 7 may be a pilot duty load, such as a traffic light, signal beacon, control circuit, etc.

In some aspects, the wet/dry contact sequencer 1 controls the on/off timing sequencing of two contacts either in series or in parallel for the purpose of having the wet contact break or make the connection under current, while the dry contact breaks or makes the connection or disconnection under no current. For example and as illustrated in FIG. 1, the dry relay 5 is connected in series with the wet relay 6, with the dry relay 5 being configured to break or make the connection or disconnection under no current while the wet relay 6 is configured to break or make the connection or disconnection under current and while being arc suppressed (e.g., by the arc suppressor 8).

In some aspects, the wet/dry contact sequencer 1 is configured to operate in support of the arc suppressed wet relay 6. In various examples, stand-alone-operation does not necessarily require additional connections, devices or manipulations other than those outlined in this document. Without an arc suppressor connected, the wet contactor or relay contacts may become sacrificial and the dry contactor or relay contacts may remain in excellent condition during normal operation of the wet/dry contact sequencer 1.

Figure 2:
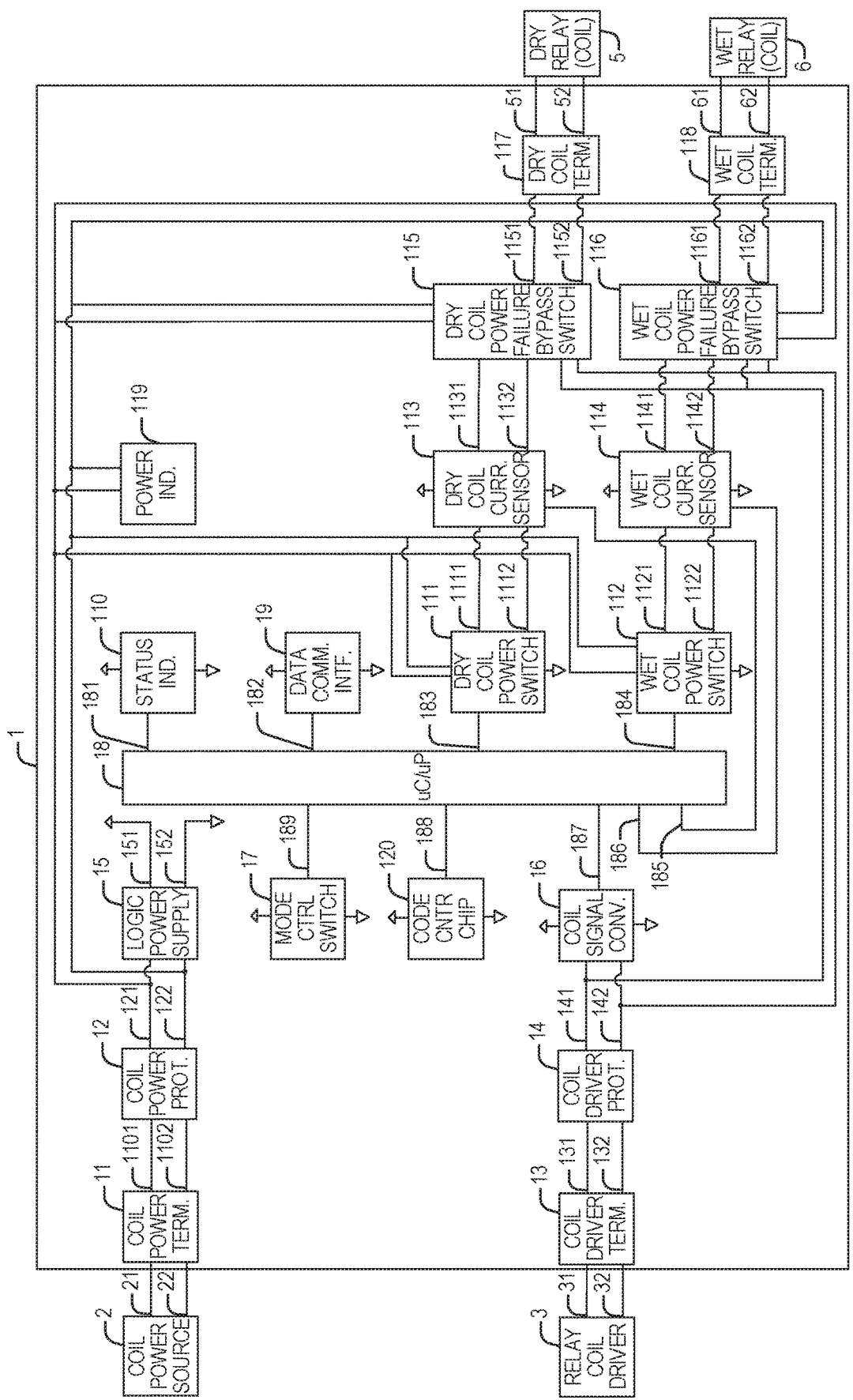
FIG. 2 is a block diagram of an example of a wet/dry contact sequencer, according to some embodiments.
Figure 3A:
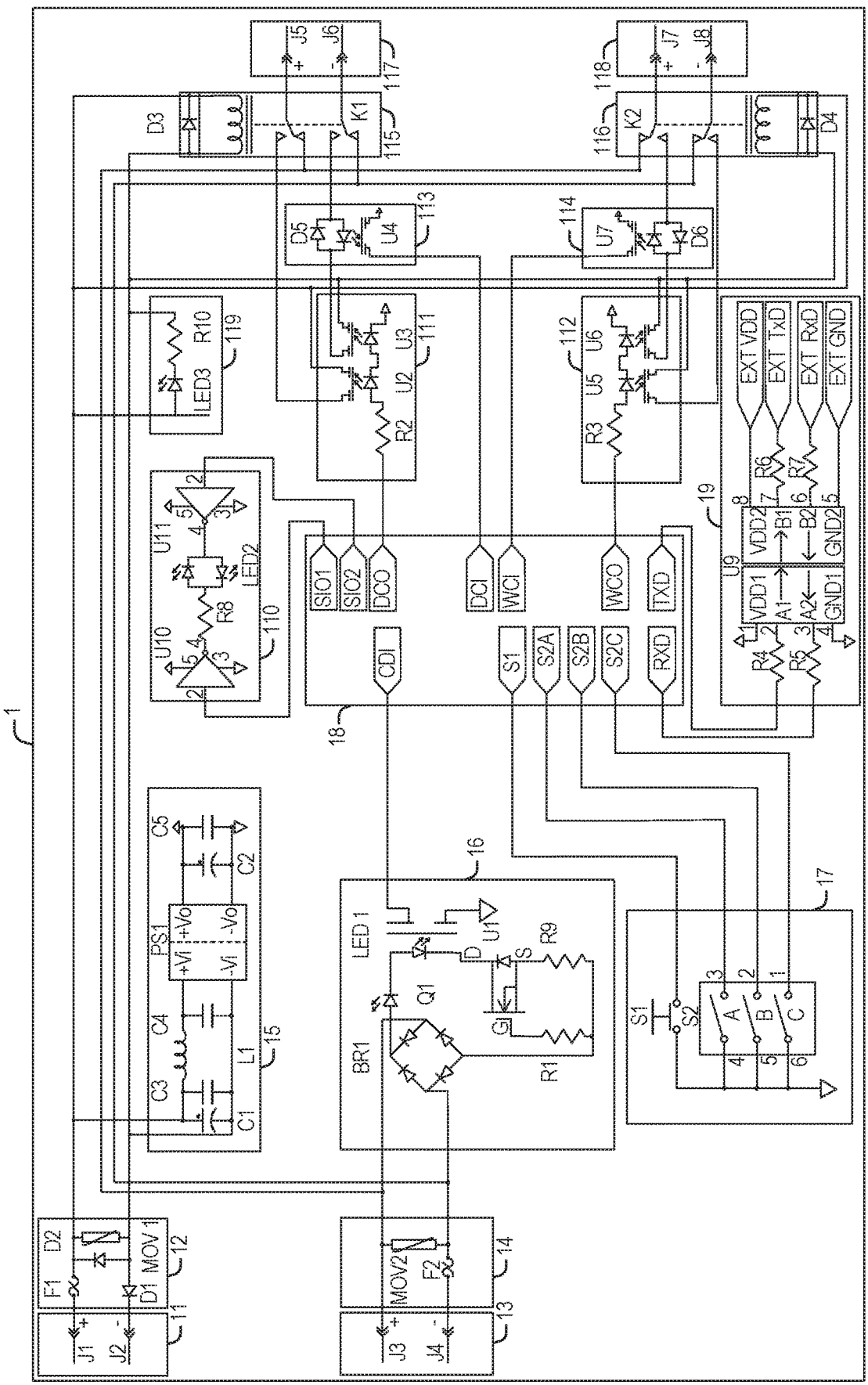
FIG. 3A is a schematic diagram of the example wet/dry contact sequencer of FIG. 2, according to some embodiments.
Figure 3B:
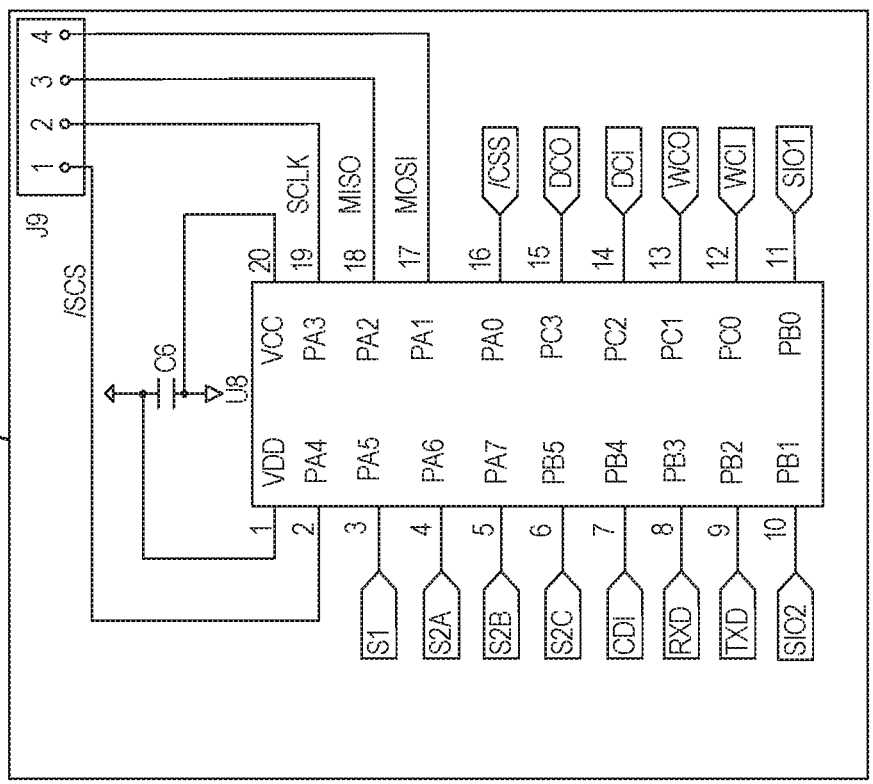
FIG. 3B is a schematic diagram illustrating input and output signal configurations of a controller circuit within the example wet/dry contact sequencer of FIG. 2, according to some embodiments.
Figure 3C:
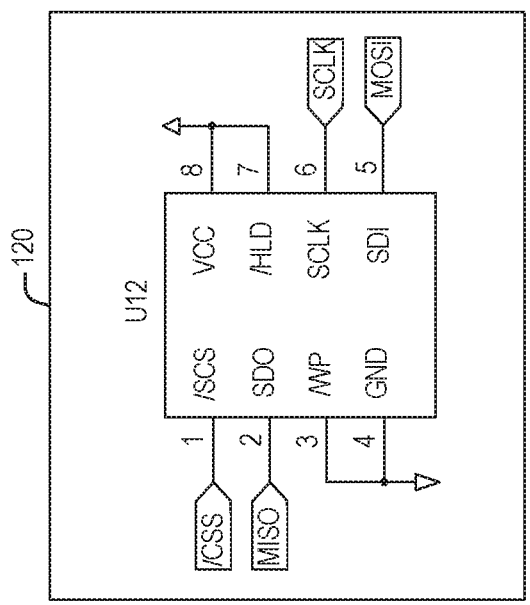
FIG. 3C is a schematic diagram of a code control chip within the example wet/dry contact sequencer of FIG. 2, according to some embodiments.

In some aspects, various implementations of the wet/dry contact sequencer 1 (e.g., in connection with various embodiments as illustrated in FIG. 2-FIG. 3C) may be configured to provide one or more of the following functionalities or features: AC or DC coil power and contact operation; authenticity and license control mechanisms; auto-detect functions; automatically generate service and maintenance calls; provide automatic fault detection; provide automatic power failure coil signal bypass; provide auto mode settings; provide a bar graph indicator; provide a behavior pattern learning resulting in out-of-pattern detection and indication; provide a Bluetooth interface; calculate, store and display historical data, values, and ranges for all signal inputs; calculate, store, and display statistical data, values, and ranges for all signal inputs; provide a code verification chip; provide coil fault detection and indication; provide communication access control; data communication interfaces and protocols; provide date and time event logging; enabling off-site troubleshooting; enabling faster cycle times; enabling lower duty cycles; enabling heavy duty operation with lighter duty contactors or relays; enabling high dielectric operation; enabling high power operation; enabling low leakage operation; enabling relays to replace contactors; encrypted data transmissions; provide an Ethernet interface; provide failure alarms; provide fault alerts; provide fault code clearing mechanisms; provide fault detection for out-of-spec or out-of-range parameters (e.g., chatter, cycle time, duty cycle, cycle speed, on duration, off duration, etc.); provide fault indication flash codes; provide fault history and statistics; provide hours-of-service counter; utilize hybrid power relays, contactors, and circuit breakers; utilize hybrid-power-switching controllers; provide LAN/WAN connectivity; provide connectivity for local or remote firmware upgradability, register access, system diagnostics, and remote troubleshooting provide mode control selection; provide multi-phase configuration; provide operating mode indication; provide parameter history and statistics; provide power indication; provide processor status indication color codes; provide relay coil driver history and statistics; provide relay coil driver fault detection and indication; provide relay coil parameter history and statistics; provide relay coil state indication; provide processor status indication color codes; provide single-phase configuration; provide high dielectric isolation between power source and power load; support low leakage current between power source and power load; provide an SPI bus interface; provide triggering of automatic service calls; provide a universal data interface, such as Universal Asynchronous Receiver/Transmitter (UART) interface; and provide a USB interface, user access control, and a Wi-Fi interface.

The coil power source 2 is an external auxiliary power source, which is configured to provide power to the wet and dry relay coils (6 and 5, respectively) according to the wet/dry contact sequencer 1. The first coil power source node 21 may be configured as a first coil power termination input (e.g., to coil power termination 11 in FIG. 2). The second coil power source node 22 may be configured as the second coil power termination input. The coil power source 2 may be a single-phase or a multi-phase power source. Additionally, the coil power source 2 may be an AC power type or a DC power type.

The relay coil driver 3 is the external relay coil signal source which provides information about the energization status for the wet relay 6 coil and the dry relay 5 coil according to the control of the wet/dry contact controller 1.

In this regard, the external relay coil driver 3 is configured to provide a control signal. The first relay coil driver node 31 is a first coil driver termination input (e.g., to call driver termination 13 in FIG. 2). The second relay coil driver node 32 may be configured as the second coil driver termination input. The relay coil driver 3 may be a single-phase or a multi-phase power source. Additionally, the relay coil driver 3 may be an AC power type or a DC power type.

The dry relay 5 may include two sections—a dry relay coil and dry relay contacts. As mentioned above. "dry" refers to the specific mode of operation of the contacts in this relay which makes or breaks the current connection between the contacts while not carrying current.

The first dry relay node 51 is the first dry relay 5 coil input from the wet/dry contact sequencer 1. The second dry relay node 52 is the second dry relay 5 coil input from the wet/dry contact sequencer 1. The third dry relay node 53 is the first dry relay contact connection with the main power source 4. The fourth dry relay node 54 is the second dry relay contact connection with the main power source 4. The fifth dry relay node 55 is the third dry relay contact connection with the main power source 4. The dry relay 5 may be configured to operate with a single-phase or a multi-phase power source. Additionally, the dry relay 5 may be an AC power type or a DC power type.

The wet relay 6 may include two sections—a wet relay coil and wet relay contacts. As mentioned above, "wet" refers to the specific mode of operation of the contacts in this relay which makes or breaks the current connection between the contacts while carrying current.

The first wet relay node 61 is the first wet relay 6 coil input from the wet/dry contact sequencer 1. The second wet relay node 62 is the second wet relay 6 coil input from the wet/dry contact sequencer 1. The third wet relay node 63 is the first wet relay contact connection with the main power load 7. The fourth wet relay node 64 is the second wet relay contact connection with the main power load 7. The fifth wet relay node 65 is the third wet relay contact connection with the main power load 7. The sixth wet relay node 66 is the fourth wet relay contact connection with the dry relay contacts. The seventh wet relay node 67 is the fifth wet relay contact connection with the dry relay contacts. The eighth wet relay node 68 is the sixth wet relay contact connection with the dry relay contacts. The wet relay 6 may be configured to operate with a single-phase or a multi-phase power source. Additionally, the wet relay 6 may be an AC power type or a DC power type.

The arc suppressor 8 is configured to provide arc suppression for the wet relay 6 contacts. The arc suppressor 8 may be either external to the wet/dry contact sequencer 1 or, alternatively, may be implemented as an integrated part of the wet/dry contact sequencer 1. The arc suppressor 8 may be configured to operate with a single-phase or a multi-phase power source. Additionally, the arc suppressor 8 may be an AC power type or a DC power type.

FIG. 2 is a block diagram of an example of a wet/dry contact sequencer (e.g., the wet/dry contact sequencer 1 of FIG. 1), according to some embodiments. Referring to FIG. 2, the wet/dry contact sequencer 1 comprises a coil power termination circuit 11, a coil power protection circuit 12, a logic power supply 15, mode control switches 17, a controller (also referred to as microcontroller or microprocessor) 18, a coil driver termination circuit 13, a coil driver protection circuit 14, a coil signal converter circuit 16, a code control chip 120, a status indicator 110, data communication interface 19, a dry coil power switch 111, a dry coil current sensor 113, a dry coil power failure bypass switch 115, a dry coil termination circuit 117, a wet coil power switch 112, a wet coil current sensor 114, a wet coil power failure bypass switch 116, and a wet coil termination circuit 118.

The coil power termination circuit 11 is configured to provide a wire connection to the wet/dry contact sequencer 1. The first coil power termination node 1101 is the first coil power protection circuit 12 input. The second coil power termination node 1102 is the second coil power protection circuit 12 input.

The coil power protection circuit 12 is configured to provide protection to all elements of the wet/dry contact sequencer 1. The first coil power protection node 121 is the first logic power supply 15 input. The second coil power protection node 122 is the second logic power supply 15 input.

The coil driver termination circuit 13 is configured to provide a wire connection to the wet/dry contact sequencer 1. The first coil driver termination circuit node 131 is the first coil driver protection circuit 14 input. The second coil driver termination circuit node 132 is the second coil driver protection circuit 14 input.

The coil driver protection circuit 14 is configured to provide protection to all digital logic elements of the wet/dry contact sequencer 1. The first coil driver protection circuit output 141 is the first coil signal converter circuit 16 input. The second coil driver protection circuit output 142 is the second coil signal converter circuit 16 input.

The logic power supply 15 is configured to provide logic level voltage to all digital logic elements of the wet/dry contact sequencer 1. The first logic power supply output 151 is the positive power supply terminal indicated by the positive power schematic symbol in FIG. 2. The second logic power supply output 152 is the negative power supply terminal indicated by the ground reference symbol in FIG. 2.

The coil signal converter circuit 16 converts a signal indicative of the energization status of the wet and dry coils from the relay coil driver 3 into a logic level type signal communicated to the controller 18 via node 187 for further processing.

The mode control switches 17 allow manual selection of specific modes of operation for the wet/dry contact sequencer 1.

The controller 18 comprises suitable circuitry, logic, interfaces, and/or code and is configured to control the operation of the wet/dry contact sequencer 1 through, e.g., software/firmware-based operations, routines, and programs. The first controller node 181 is the status indicator 110 connection. The second controller node 182 is the data communication interface 19 connection. The third controller node 183 is the dry coil power switch 111 connection. The fourth controller node 184 is the wet coil power switch 112 connection. The fifth controller node 185 is the dry coil current sensor 113 connection. The sixth controller node 186 is the wet coil current sensor 114 connection. The seventh node 187 is the coil signal converter circuit 16 connection. The eight controller node 188 is the code control chip 120 connection. The ninth controller node 189 is the mode control switches 17 connection.

In some aspects, controller 18 may be configured to control one or more of the following operations associated with the wet/dry sequencer 1: operation management; authenticity code control management; auto-detect operations; auto-detect functions; automatic normally closed or normally open contact form detection; auto mode settings; coil cycle (Off, Make, On, Break, Off) timing, history, and statistics; coil delay management; history management; contact sequencing; coil driver signal chatter history and statistics; data management (e.g., monitoring, detecting, recording, logging, indicating, and processing); data value registers for present, last, past, maximum, minimum, mean, average, standard deviation values, etc.; date and time formatting, logging, and recording; embedded microcontroller with clock generation, power on reset, and watchdog timer; error, fault, and failure management; factory default value recovery management; firmware upgrade management; flash code generation; fault indication clearing; fault register reset; hard reset; interrupt management; license code control management; power-on management; power-up sequencing; power hold-over management; power turn-on management; reading from inputs, memory, or registers; register address organization; register data factory default values; register data value addresses; register map organization; soft reset management; SPI bus link management; statistics management; system access management; system diagnostics management; UART communications link management; wet/dry relay coil management; and writing to memory, outputs, and registers.

The data communications interface 19 is an optional element of the wet/dry contact sequencer 1 as data communication is not required for the full functional operation of the sequencer. Data signal filtering, transient, over-voltage, over-current, and wire termination are not shown in the example in FIG. 2. In some aspects, the data communications interface 19 can be configured as an interface between the wet/dry contact sequencer 1 and one or more of the following: a Bluetooth controller, an Ethernet controller, a General Purpose Data Interface, a Human-Machine-Interface, an SPI bus interface, a UART interface, a USB controller, and a Wi-Fi controller.

The status indicator 110 provides audible, visual, or other user alerting methods through operational, health, fault, code indication via specific colors or flash patterns. In some aspects, the status indicator 110 may provide one or more of the following types of indications: bar graphs, graphic display, LEDs, a coil driver fault indication, a coil state indication, a dry coil fault indication, a mode of operation indication, a processor health indication, and wet coil fault indication.

The dry coil power switch 111 connects the externally provided coil power to the dry relay coil 5 via nodes 51 and 52 based on the signal output from controller 18 via command output node 183.

The wet coil power switch 112 connects the externally provided coil power to the wet relay coil 6 via nodes 61 and 62 based on the signal output from controller 18 via command output node 184.

The dry coil current sensor 113 is configured to sense the value and/or the absence or presence of the dry relay coil 5 current.

The wet coil current sensor 114 is configured to sense the value and/or the absence or presence of the dry relay coil 6 current.

The dry coil power failure bypass switch 115 is configured to provide a fail-safe operation mechanism to keep the wet relay and the dry relay operating without the benefit of the wet/dry contact sequencer 1. For example, upon coil power failure (e.g., failure of the coil power source 2), the logic power supply 15 no longer provides power to the wet/dry contact sequencer 1 and thus the controller 18 no longer operates (i.e., controller 18 no longer provides any kind of control or indication mechanisms). In order to keep the power switching operation functional, the dry coil power failure bypass switch 115 may be configured to maintain the operation of the relays based on input from the relay coil driver 3 via the coil driver protection circuit 16.

The wet coil power failure bypass switch 116 is configured to provide a fail-safe operation mechanism to keep the wet relay and the dry relay operating without the benefit of the wet/dry contact sequencer 1. For example, upon coil power failure (e.g., failure of the coil power source 2), the logic power supply 15 no longer provides power to the wet/dry contact sequencer 1 and thus the controller 18 no longer operates (i.e., controller 18 no longer provides any kind of control or indication mechanisms). In order to keep the power switching operation functional, the dry coil power failure bypass switch 115 may be configured to maintain the operation of the relays based on input from the relay coil driver 3 via the coil driver protection circuit 16.

The dry coil termination circuit 117 is configured to provide a wire connection to the dry relay 5 coil. The wet coil termination circuit 118 is configured to provide a wire connection to the wet relay 6 coil.

The power indicator 119 indicates whether the coil power source 2 is providing voltage to the wet/dry contact sequencer 1.

The code control chip 120 is an optional element of the wet/dry contact sequencer 1, and it is not required for the fully functional operation of the wet/dry contact sequencer. In some aspects, the code control chip 120 may be configured to include application or customer specific code with encrypted or non-encrypted data security. In some aspects, the code control chip 120 function may be implemented externally via the data communication interface 19. In some aspects, the code control chip 120 may be configured to store the following information: access control code and data, alert control code and data, authentication control code and data, encryption control code and data, chip control code and data, license control code and data, validation control code and data, and/or checksum control code and data. In some aspects, the code control chip 120 may be implemented as an internal component of controller 18 or may be a separate circuit that is external to controller 18 (e.g., as illustrated in FIG. 2).

FIG. 3A is a schematic diagram of the example wet/dry contact sequencer 1 of FIG. 2, according to some embodiments. More specifically. FIG. 3A illustrates schematic diagrams of the coil power termination circuit 11, the coil power protection circuit 12, the coil driver termination circuit 13, the coil driver protection circuit 14, the logic power supply 15, the coil signal converter circuit 16, the mode control switches 17, the data communication interface 19, the status indicators 110, the dry coil power switch 111, the wet coil power switch 112, the dry coil current sensor 113, the wet coil current sensor 114, the dry coil power failure bypass switch 115, the wet coil power failure bypass switch 116, the dry coil termination circuit 117, and the wet coil termination circuit 118.

In some aspects, the coil power termination circuit 11 may include the following elements: a first coil power terminal J1 and a second coil power terminal J2. In some aspects, the coil power protection circuit 12 may include the following elements: an overvoltage protection arrangement MOV1, an overcurrent protection element (e.g., a fuse) F1, and reverse polarity protection diodes D1 and D2. In some aspects, transient and noise filtering elements may be included as part of the coil power protection circuit 12.

In some aspects, the coil driver termination circuit 13 may include the following elements: a first relay coil driver terminal J3 and a second relay coil driver terminal J4. In some aspects, the coil driver protection circuit 14 may include the following elements: an overvoltage protection arrangement MOV2 and an overcurrent protection element (e.g., a fuse) F2. In some aspects, the coil driver protection circuit 14 may include reverse polarity protection. In some aspects, the court driver protection circuit 14 may include transient and noise filtering elements.

In some aspects, the logic power supply 15 may include the following elements: a DC-to-DC converter PS1 (or an AC-to-DC converter if the power supply is coupled to an AC source); input noise filtering and transient protection via capacitive elements C3, C4, and inductance L1; an input bulk energy storage capacitor C1; an output bulk energy storage capacitor C2; and an output noise filtering capacitor C5. In some aspects, the logic power supply 15 may include an external power converter. In some aspects, the following functions may be provided internally to PS1 (or may be provided externally as an option): dielectric isolation, overvoltage protection, overcurrent protection, product safety certifications, and electromagnetic compatibility certifications.

In some aspects, the coil signal converter 16 may include the following elements: current limiting elements such as a solid-state relay U1 and resistors R1 and R9; dielectric isolation U1; signal indication LED1; and signal rectification (e.g., a bridge rectifier) BR1. In some aspects, the coil signal converter 16 may optionally include signal filtering, signal shaping, transient filtering, and noise filtering.

In some aspects, the mode control switches 17 may include the following elements: push buttons S1 for hard resets, clearings, or acknowledgements; and DIP switches S2. Alternatively, the mode control switches 17 may include keypad or keyboard switches.

The data communications interface 19 may include the following elements: a digital signal isolator U9; and internal transmit data (TxD) termination R4; and internal receive data (RxD) termination R5; an external receive data (Ext RxD) termination R6; and an external transmit data (Ext TxD) termination R7.

In some aspects, the status indicators 110 may include the following elements: signal buffers, drivers, or inverters U10 and U11; a dual LED LED2; and an LED current limiting element R8.

In some aspects, the dry coil power switch 111 may include the following elements: solid-state relays U2 and U3; and a current limiting element R2. In some aspects, the dry coil power switch 111 may optionally include electromechanical relays.

In some aspects, the wet coil power switch 112 may include the following elements: solid-state relays U2 and U3; and a current limiting element R3. In some aspects, the wet coil power switch 111 may optionally include electromechanical relays.

In some aspects, the dry coil current sensor 113 may include the following elements: a solid-state relay U4; and a reverse polarity protection element D5. In some aspects, the dry coil current sensor 113 may optionally include optoisolators, optocouplers, solid-state relays, Reed relays, and/or Hall effect sensors. Alternatively, the dry coil current sensor 113 may be configured with SSR AC or DC input, and SSR AC or DC output.

In some aspects, the wet coil current sensor 114 may include the following elements: a solid-state relay U4; and a reverse polarity protection element D5. In some aspects, the wet coil current sensor 114 may optionally include optoisolators, optocouplers, solid-state relays, Reed relays, and/or Hall effect sensors. Alternatively, the wet coil current sensor 114 may be configured with SSR AC or DC input, and SSR AC or DC output.

In some aspects, the dry coil power failure bypass switch 115 may include the following elements: a dual pole dual throw (DPDT) relay K1; and an electromagnetic field (EMF) fly-back voltage suppression diode D3. In some aspects, the dry coil power failure bypass switch 115 is configured to provide the following functions: coil power failure protection; and automatic relay coil driver bypass. In some aspects, the dry coil power failure bypass switch 115 may optionally include a single DPDT configuration, a multi-form configuration, or another type of configuration.

In some aspects, the wet coil power failure bypass switch 116 may include the following elements: a dual pole dual throw (DPDT) relay K2; and an electromagnetic field (EMF) fly-back voltage suppression diode D4. In some aspects, the wet coil power failure bypass switch 116 is configured to provide the following functions: coil power failure protection; and automatic relay coil driver bypass. In some aspects, the wet coil power failure bypass switch 116 may optionally include a single DPDT configuration, a multi-form configuration, or another type of configuration.

In some aspects, the dry coil power termination 117 may include the following elements: a first dry coil terminal J5; and a second dry coil terminal J6.

In some aspects, the wet coil power termination 118 may include the following elements: a first dry coil terminal J7; and a second dry coil terminal J8.

In some aspects, the power indicator 119 may include a power indicator element LED3 and a resistor R10.

FIG. 3B is a schematic diagram illustrating input and output signal configurations of a controller circuit within the example wet/dry contact sequencer of FIG. 2, according to some embodiments. Specifically, controller signal inputs of controller 18 may include CDI, DCI, RXD, S1, S2A, S2B, S2C, and WCI. Signal outputs of controller 18 may include DCO, SIO1, SIO2. TXD, and WCO.

In some aspects, the controller 18 coil driver input pin (CDI) receives the logic state of the coil signal converter 16. CDI may be the logic state of the de-energized coil driver, and /CDI may be the logic state of the energized coil driver. In this regard, CDI may be normally high when relay coil driver voltage is not present, and CDI may be pulled low when relay coil driver voltage is present.

In some aspects, the controller 18 dry coil input pin (DCI) receives the logic state of the dry coil current sensor 113. DCI is the logic state when the dry coil current is absent, and /DCI is the logic state when the dry coil current is present.

In some aspects, the controller 18 received data input pin (RXD) receives the receive data logic state from the data communications interface 19. RXD identifies the receive data communications mark, and /RXD identifies the receive data communications space.

In some aspects, the controller 18 push button switch input pin (S1) receives the logic state from the mode control switches interface 17. S1 represents the push button open logic state, and /S1 represents the push button closed logic state.

In some aspects, the controller 18 DIP switch input pin (S2A) receives the logic state from the mode control switches interface 17. S2A is the logic label state when the DIP switch is open, and /S2A is the logic label state when the DIP switch is closed.

In some aspects, the controller 18 DIP switch input pin (S2B) receives the logic state from the mode control switches interface 17. S2B is the logic label state when the DIP switch is open, and /S2B is the logic label state when the DIP switch is closed.

In some aspects, the controller 18 DIP switch input pin (S2C) receives the logic state from the mode control switches interface 17. S2C is the logic label state when the DIP switch is open, and /S2C is the logic label state when the DIP switch is closed.

In some aspects, the controller 18 wet coil input pin (WCI) receives the logic state of the wet coil current sensor 114. WCI is the logic label state when the wet coil current is absent, and /WCI is the logic label state when the wet coil current is present.

In some aspects, the controller 18 dry coil output pin (DCO) transmits the logic state to the dry coil power switch 111. DCO is the logic label state when the dry coil output is energized, and /DCO is the logic label state when the dry coil output is de-energized.

In some aspects, the controller 18 status indicator output pin (SIO1) transmits the logic state to the status indicators 110. SIO1 is the logic label state when the status indicator 1 output is high, and /SIO1 is the logic label state when the status indicator 1 output is low.

In some aspects, the controller 18 status indicator output pin (SIO2) transmits the logic state to the status indicators 110. SIO2 is the logic label state when the status indicator 2 output is high, and /SIO2 is the logic label state when the status indicator 2 output is low.

In some aspects, the controller 18 transmit data output pin (TXD) transmits the transmit data logic state to the data communications interface 19. TXD is the logic label state identifying the transmit data communications mark, and /TXD is the logic label state identifying the transmit data communications space.

In some aspects, the controller 18 dry coil output pin (WCO) transmits the logic state to the wet coil power switch 112. WCO is the logic state when the wet coil output is energized, and /WCO is the logic state when the wet coil output is de-energized.

As illustrated in FIG. 3B, the controller 18 may also include a serial peripheral interface (SPI) J9 with the following signal connections: master-out-serial-in (MOSI), master-in-serial-out (MISO) and shift clock (SCLK) for the serial data.

FIG. 3C is a schematic diagram of a code control chip (e.g., 120) within the example wet/dry contact sequencer of FIG. 2, according to some embodiments. Referring to FIG. 3C, the code control chip 120 can be configured with inputs and outputs for serial data communications. In some aspects, the code control chip 120 may include memory for storing fixed programs, temporary data, and sequencing algorithms (e.g., as discussed in connection with FIG. 4).

In some aspects, the wet/dry contact sequencer 1 registers may be located internally or externally to the controller 18. For example, the code control chip 120 can be configured to store the wet/dry contact sequencer 1 registers that are described hereinbelow.

In some aspects, address and data may be written into or read back from the registers through a communication interface using either UART, SPI or any other processor communication method.

In some aspects, the registers may contain data for the following operations: calculating may be understood to involve performing mathematical operations; controlling may be understood to involve processing input data to produce desired output data; detecting may be understood to involve noticing or otherwise detecting a change in the steady state; indicating may be understood to involve issuing notifications to the users; logging may be understood to involve associating dates, times, and events; measuring may be understood to involve acquiring data values about physical parameters; monitoring may be understood to involve observing the steady states for changes; processing may be understood to involve performing controller or processor-tasks for one or more events; and recording may be understood to involve writing and storing events of interest into mapped registers.

In some aspects, the wet/dry contact sequencer 1 registers may contain data arrays, data bits, data bytes, data matrixes, data pointers, data ranges, and data values.

In some aspects, the wet/dry contact sequencer 1 registers may store control data, default data, functional data, historical data, operational data, and statistical data. In some aspects, the wet/dry contact sequencer 1 registers may include authentication information, encryption information, processing information, production information, security information, and verification information. In some aspects, the wet/dry contact sequencer 1 registers may be used in connection with external control, external data processing, factory use, future use, internal control, internal data processing, and user tasks.

In some aspects, reading a specific register byte, bytes, or bits may reset the value to zero (0).

The following are example registers that can be configured for the wet/dry contact sequencer 1.

In some aspects, a mode register (illustrated in TABLE 1) may be configured to contain the data bits for the selected sequencer mode. For example, the sequencer may be shut down in order to reduce the current draw to a minimum level. Shutting down the sequencer powers down all active components of the wet/dry contact sequencer 1, including the controller 18. In this mode, the module may not respond to any external input or communication command. A temporary transition to the high state on the sequencer's external reset switch/pin is required to bring the wet/dry contact sequencer 1 back to normal operation. The wet/dry contact sequencer 1 may be pre-loaded with register default settings. In the default mode, the wet/dry contact sequencer 1 may operate stand-alone and independently as instructed by the factory default settings.

In some aspects, the following Read and Write commands may be used in connection with the mode register: Read @ 0x60, and Write @ 0x20.

TABLE 1

| Mode Register | BIT NUMBER | | | | | | | |
|---|---|---|---|---|---|---|---|---|
| FUNCTION | 7 | 6 | 5 | 4 | 3 | 2 | 1 | 0 |
| INDICATE_FAULTS & FAILURES | 1 | — | — | — | — | — | — | — |
| None | 0 | — | — | — | — | — | — | — |
| INDICATE_NONE | — | 1 | — | — | — | — | — | — |
| None | — | 0 | — | — | — | — | — | — |
| INDICATE_ALL | — | — | 1 | — | — | — | — | — |
| None | — | — | 0 | — | — | — | — | — |
| STOP_ON_FAILURE | — | — | — | 1 | — | — | — | — |
| None | — | — | — | 0 | — | — | — | — |
| HALT_ON_FAULT | — | — | — | — | 1 | — | — | — |
| None | — | — | — | — | 0 | — | — | — |
| RESET | — | — | — | — | — | 1 | — | — |
| None | — | — | — | — | — | 0 | — | — |
| CLEAR | — | — | — | — | — | — | 1 | — |
| None | — | — | — | — | — | — | 0 | — |
| DEFAULT | — | — | — | — | — | — | — | 1 |
| None | — | — | — | — | — | — | — | 0 |

In some aspects, an alert register (illustrated in TABLE 2) may be configured to contain the data bits for the selected alert method.

In some aspects, the following Read and Write commands may be used in connection with the alert register: Read@0x61, and Write @0x21.

TABLE 2

| Alert Register | BIT NUMBER | | | | | | | |
|---|---|---|---|---|---|---|---|---|
| FUNCTION | 7 | 6 | 5 | 4 | 3 | 2 | 1 | 0 |
| VOICE | 1 | — | — | — | — | — | — | — |
| None | 0 | — | — | — | — | — | — | — |
| COMM | — | 1 | — | — | — | — | — | — |
| None | — | 0 | — | — | — | — | — | — |
| BUZZER | — | — | 1 | — | — | — | — | — |
| None | — | — | 0 | — | — | — | — | — |
| SPEAKER | — | — | — | 1 | — | — | — | — |
| None | — | — | — | 0 | — | — | — | — |
| RECORD | — | — | — | — | 1 | — | — | — |
| None | — | — | — | — | 0 | — | — | — |
| SOUND | — | — | — | — | — | 1 | — | — |
| None | — | — | — | — | — | 0 | — | — |
| DISPLAY | — | — | — | — | — | — | 1 | — |
| None | — | — | — | — | — | — | 0 | — |
| LED | — | — | — | — | — | — | — | 1 |
| None | — | — | — | — | — | — | — | 0 |

In some aspects, a code control register (illustrated in TABLE 3) may be configured to contain the data array pointers for the selected code type.

In some aspects, the following Read and Write commands may be used in connection with the code control register: Read @ 0x62, and Write @ 0x22.

TABLE 3

| Code Control Register | BIT NUMBER | | | | | | | |
|---|---|---|---|---|---|---|---|---|
| FUNCTION | 7 | 6 | 5 | 4 | 3 | 2 | 1 | 0 |
| CHECKSUM | 1 | — | — | — | — | — | — | — |
| None | 0 | — | — | — | — | — | — | — |
| VALIDATION | — | 1 | — | — | — | — | — | — |
| None | — | 0 | — | — | — | — | — | — |
| LICENSE | — | — | 1 | — | — | — | — | — |
| None | — | — | 0 | — | — | — | — | — |
| CHIP | — | — | — | 1 | — | — | — | — |
| None | — | — | — | 0 | — | — | — | — |
| ENCRYPT | — | — | — | — | 1 | — | — | — |
| None | — | — | — | — | 0 | — | — | — |
| AUTHENTIC | — | — | — | — | — | 1 | — | — |
| None | — | — | — | — | — | 0 | — | — |
| ALERT | — | — | — | — | — | — | 1 | — |
| None | — | — | — | — | — | — | 0 | — |
| ACCESS | — | — | — | — | — | — | — | 1 |
| None | — | — | — | — | — | — | — | 0 |

In some aspects, a contact limits register (illustrated in TABLE 4) may be configured to contain the data array pointers for the selected contact limit specification.

In some aspects, the following Read and Write commands may be used in connection with the contact limits register: Read @ 0x63, and Write @ 0x23.

TABLE 4

| Contact Limits Register | BIT NUMBER | | | | | | | |
|---|---|---|---|---|---|---|---|---|
| FUNCTION | 7 | 6 | 5 | 4 | 3 | 2 | 1 | 0 |
| MAX_MECH_LIFE | 1 | — | — | — | — | — | — | — |
| None | 0 | — | — | — | — | — | — | — |

TABLE 4-continued

| Contact Limits Register | BIT NUMBER | | | | | | | |
|---|---|---|---|---|---|---|---|---|
| FUNCTION | 7 | 6 | 5 | 4 | 3 | 2 | 1 | 0 |
| MAX_ELEC_LIFE | — | 1 | — | — | — | — | — | — |
| None | — | 0 | — | — | — | — | — | — |
| MAX_CYCLES_PER_MINUTE | — | — | 1 | — | — | — | — | — |
| None | — | — | 0 | — | — | — | — | — |
| MAX_DUTY_CYCLE | — | — | — | 1 | — | — | — | — |
| None | — | — | — | 0 | — | — | — | — |
| MIN_DUTY_CYCLE | — | — | — | — | 1 | — | — | — |
| None | — | — | — | — | 0 | — | — | — |
| MIN_OFF_DURATION | — | — | — | — | — | 1 | — | — |
| None | — | — | — | — | — | 0 | — | — |
| MIN_ON_DURATION | — | — | — | — | — | — | 1 | — |
| None | — | — | — | — | — | — | 0 | — |
| MIN_CYCLE_TIME | — | — | — | — | — | — | — | 1 |
| None | — | — | — | — | — | — | — | 0 |

In some aspects, a data communication register (illustrated in TABLE 5) may be configured to contain the data bits for the selected data communications method.

In some aspects, the following Read and Write commands may be used in connection with the data communication register: Read @ 0x64; and Write @0x24.

TABLE 5

| Data Comm Register | BIT NUMBER | | | | | | | |
|---|---|---|---|---|---|---|---|---|
| FUNCTION | 7 | 6 | 5 | 4 | 3 | 2 | 1 | 0 |
| PROTOCOL | 1 | — | — | — | — | — | — | — |
| None | 0 | — | — | — | — | — | — | — |
| HMI | — | 1 | — | — | — | — | — | — |
| None | — | 0 | — | — | — | — | — | — |
| BLUETOOTH | — | — | 1 | — | — | — | — | — |
| None | — | — | 0 | — | — | — | — | — |
| ETHERNET | — | — | — | 1 | — | — | — | — |
| None | — | — | — | 0 | — | — | — | — |
| WIFI | — | — | — | — | 1 | — | — | — |
| None | — | — | — | — | 0 | — | — | — |
| USB | — | — | — | — | — | 1 | — | — |
| None | — | — | — | — | — | 0 | — | — |
| SPI | — | — | — | — | — | — | 1 | — |
| None | — | — | — | — | — | — | 0 | — |
| UART | — | — | — | — | — | — | — | 1 |
| None | — | — | — | — | — | — | — | 0 |

In some aspects, a coil driver parameter register (illustrated in TABLE 6) may be configured to contain the data array pointers for the selected coil driver parameter specification.

In some aspects, the following Read and Write commands may be used in connection with the coil driver parameter register: Read @ 0x65, and Write @0x25.

TABLE 6

| Coil Driver Parameters Register | | | BIT NUMBER | | | | | |
|---|---|---|---|---|---|---|---|---|
| FUNCTION | 7 | 6 | 5 | 4 | 3 | 2 | 1 | 0 |
| COIL_DRIVER_PATTERN | 1 | — | — | — | — | — | — | — |
| None | 0 | — | — | — | — | — | — | — |
| COIL_DRIVER_OFF_CHATTER | — | 1 | — | — | — | — | — | — |
| None | — | 0 | — | — | — | — | — | — |
| COIL_DRIVER_ON_CHATTER | — | — | 1 | — | — | — | — | — |
| None | — | — | 0 | — | — | — | — | — |
| COIL_DRIVER_FREQUENCY | — | — | — | 1 | — | — | — | — |
| None | — | — | — | 0 | — | — | — | — |
| COIL_DRIVER_CYCLE_TIME | — | — | — | — | 1 | — | — | — |
| None | — | — | — | — | 0 | — | — | — |
| COIL_DRIVER_DUTY_CYCLE | — | — | — | — | — | 1 | — | — |
| None | — | — | — | — | — | 0 | — | — |
| COIL_DRIVER_ON_DURATION | — | — | — | — | — | — | 1 | — |
| None | — | — | — | — | — | — | 0 | — |
| COIL_DRIVER_OFF_DURATION | — | — | — | — | — | — | — | 1 |
| None | — | — | — | — | — | — | — | 0 |

In some aspects, a coil driver pattern register (illustrated in TABLE 7) may be configured to contain the data bits for the selected coil driver pattern condition.

In some aspects, the following Read and Write commands may be used in connection with the coil driver pattern register: Read@0 x66, and Write@0 x26.

TABLE 7

| Coil Driver Pattern Register | | | BIT NUMBER | | | | | |
|---|---|---|---|---|---|---|---|---|
| FUNCTION | 7 | 6 | 5 | 4 | 3 | 2 | 1 | 0 |
| COIL_DRIVER_PATTERN_AQUIRED | 1 | — | — | — | — | — | — | — |
| None | 0 | — | — | — | — | — | — | — |
| COIL_DRIVER_PATTERN_DETECTED | — | 1 | — | — | — | — | — | — |
| None | — | 0 | — | — | — | — | — | — |
| COIL_DRIVER_PATTERN_LEARNED | — | — | 1 | — | — | — | — | — |
| None | — | — | 0 | — | — | — | — | — |
| OUT_OF_COIL_DRIVER_PATTERN | — | — | — | 1 | — | — | — | — |
| None | — | — | — | 0 | — | — | — | — |
| IN_COIL_DRIVER_PATTERN | — | — | — | — | 1 | — | — | — |
| None | — | — | — | — | 0 | — | — | — |
| NO_COIL_DRIVER_PATTERN | — | — | — | — | — | 1 | — | — |
| None | — | — | — | — | — | 0 | — | — |
| AQUIRE_COIL_DRIVER_PATTERN | — | — | — | — | — | — | 1 | — |
| None | — | — | — | — | — | — | 0 | — |
| IGNORE_COIL_DRIVER_PATTERN | — | — | — | — | — | — | — | 1 |
| None | — | — | — | — | — | — | — | 0 |

In some aspects, a dry delay register (illustrated in TABLE 8) may be configured to contain the values for the dry delay timing.

In some aspects, the following Read and Write commands may be used in connection with the dry relay register: Read @ 0x67, and Write @ 0x27.

TABLE 8

| Dry Delay Register | | | BIT NUMBER | | | | | |
|---|---|---|---|---|---|---|---|---|
| VALUE | 7 | 6 | 5 | 4 | 3 | 2 | 1 | 0 |
| Maximum: 2550 ms | 1 | 1 | 1 | 1 | 1 | 1 | 1 | 1 |
| Default: 100 ms | 0 | 0 | 0 | 0 | 1 | 0 | 1 | 0 |
| Minimum: 0 ms | 0 | 0 | 0 | 0 | 0 | 0 | 0 | 0 |

In some aspects, a fault register (illustrated in TABLE 9) may be configured to contain the data bits for the selected fault condition.

In some aspects, the following Read and Write commands may be used in connection with the fault register: Read @ 0x68, and Write @ 0x28.

TABLE 9

| Fault Register | | | BIT NUMBER | | | | | |
|---|---|---|---|---|---|---|---|---|
| FUNCTION | 7 | 6 | 5 | 4 | 3 | 2 | 1 | 0 |
| COMM_FAULT | 1 | — | — | — | — | — | — | — |
| None | 0 | — | — | — | — | — | — | — |
| POWER_BROWN_OUT | — | 1 | — | — | — | — | — | — |
| None | — | 0 | — | — | — | — | — | — |
| WATCH_DOG_TIMER | — | — | 1 | — | — | — | — | — |
| None | — | — | 0 | — | — | — | — | — |
| POWER_FAULT | — | — | — | 1 | — | — | — | — |
| None | — | — | — | 0 | — | — | — | — |
| DEVICE_HEALTH | — | — | — | — | 1 | — | — | — |
| None | — | — | — | — | 0 | — | — | — |

TABLE 9-continued

| Fault Register | BIT NUMBER | | | | | | | |
|---|---|---|---|---|---|---|---|---|
| FUNCTION | 7 | 6 | 5 | 4 | 3 | 2 | 1 | 0 |
| COIL_DRIVER_FAULT | — | — | — | — | — | 1 | — | — |
| None | — | — | — | — | — | 0 | — | — |
| DRY_COIL_FAULT | — | — | — | — | — | — | 1 | — |
| None | — | — | — | — | — | — | 0 | — |
| WET_COIL_FAULT | — | — | — | — | — | — | — | 1 |
| None | — | — | — | — | — | — | — | 0 |

In some aspects, a flash code register (illustrated in TABLE 10) may be configured to contain the data bits for the selected LED flash code colors.

In some aspects, the following Read and Write commands may be used in connection with the flash code register: Read @ 0x69, and Write @ 0x29.

TABLE 10

| LED Flash Code Register | BIT NUMBER | | | | | | | |
|---|---|---|---|---|---|---|---|---|
| FUNCTION | 7 | 6 | 5 | 4 | 3 | 2 | 1 | 0 |
| FLASH_CODE7 | 1 | — | — | — | — | — | — | — |
| None | 0 | — | — | — | — | — | — | — |
| FLASH_CODE6 | — | 1 | — | — | — | — | — | — |
| None | — | 0 | — | — | — | — | — | — |
| FLASH_CODE5 | — | — | 1 | — | — | — | — | — |
| None | — | — | 0 | — | — | — | — | — |
| FLASH_CODE4 | — | — | — | 1 | — | — | — | — |
| None | — | — | — | 0 | — | — | — | — |
| FLASH_CODE3 | — | — | — | — | 1 | — | — | — |
| None | — | — | — | — | 0 | — | — | — |
| FLASH_CODE2 | — | — | — | — | — | 1 | — | — |
| None | — | — | — | — | — | 0 | — | — |
| FLASH_CODE1 | — | — | — | — | — | — | 1 | — |
| None | — | — | — | — | — | — | 0 | — |
| FLASH_CODE0 | — | — | — | — | — | — | — | 1 |
| None | — | — | — | — | — | — | — | 0 |

In some aspects, a history register (illustrated in TABLE 11) may be configured to contain the data array pointers for the selected history information.

In some aspects, the following Read and Write commands may be used in connection with the history register: Read @ 0x6A, and Write @ 0x2A.

TABLE 11

| History Register | BIT NUMBER | | | | | | | |
|---|---|---|---|---|---|---|---|---|
| FUNCTION | 7 | 6 | 5 | 4 | 3 | 2 | 1 | 0 |
| STATUS | 1 | — | — | — | — | — | — | — |
| None | 0 | — | — | — | — | — | — | — |
| STATE | — | 1 | — | — | — | — | — | — |
| None | — | 0 | — | — | — | — | — | — |
| MODE | — | — | 1 | — | — | — | — | — |
| None | — | — | 0 | — | — | — | — | — |
| FAULT | — | — | — | 1 | — | — | — | — |
| None | — | — | — | 0 | — | — | — | — |
| OUTPUT | — | — | — | — | 1 | — | — | — |
| None | — | — | — | — | 0 | — | — | — |
| INPUT | — | — | — | — | — | 1 | — | — |
| None | — | — | — | — | — | 0 | — | — |
| DRIVER | — | — | — | — | — | — | 1 | — |
| None | — | — | — | — | — | — | 0 | — |
| MODE | — | — | — | — | — | — | — | 1 |
| None | — | — | — | — | — | — | — | 0 |

In some aspects, an input register (illustrated in TABLE 12) may be configured to contain the data bits for the selected input status.

In some aspects, the following Read and Write commands may be used in connection with the input register: Read @ 0x6B, and Write @ 0x2B.

TABLE 12

| Input Register | BIT NUMBER | | | | | | | |
|---|---|---|---|---|---|---|---|---|
| FUNCTION | 7 | 6 | 5 | 4 | 3 | 2 | 1 | 0 |
| DCI | 1 | — | — | — | — | — | — | — |
| None | 0 | — | — | — | — | — | — | — |
| WCI | — | 1 | — | — | — | — | — | — |
| None | — | 0 | — | — | — | — | — | — |
| RXD | — | — | 1 | — | — | — | — | — |
| None | — | — | 0 | — | — | — | — | — |
| S2C | — | — | — | 1 | — | — | — | — |
| None | — | — | — | 0 | — | — | — | — |
| S2B | — | — | — | — | 1 | — | — | — |
| None | — | — | — | — | 0 | — | — | — |
| S2A | — | — | — | — | — | 1 | — | — |
| None | — | — | — | — | — | 0 | — | — |
| S1 | — | — | — | — | — | — | 1 | — |
| None | — | — | — | — | — | — | 0 | — |
| CDI | — | — | — | — | — | — | — | 1 |
| None | — | — | — | — | — | — | — | 0 |

In some aspects, an LED color register (illustrated in TABLE 13) may be configured to contain the data bits for the selected LED color.

In some aspects, the following Read and Write commands may be used in connection with the LED color register: Read @ 0x6C, and Write @ 0x2C.

TABLE 13

| LED Color Register | BIT NUMBER | | | | | | | |
|---|---|---|---|---|---|---|---|---|
| FUNCTION | 7 | 6 | 5 | 4 | 3 | 2 | 1 | 0 |
| RED | 1 | — | — | — | — | — | — | — |
| None | 0 | — | — | — | — | — | — | — |
| RED_ORANGE | — | 1 | — | — | — | — | — | — |
| None | — | 0 | — | — | — | — | — | — |
| ORANGE_YELLOW | — | — | 1 | — | — | — | — | — |
| None | — | — | 0 | — | — | — | — | — |
| ORANGE | — | — | — | 1 | — | — | — | — |
| None | — | — | — | 0 | — | — | — | — |
| YELLOW | — | — | — | — | 1 | — | — | — |
| None | — | — | — | — | 0 | — | — | — |
| YELLOW_GREEN | — | — | — | — | — | 1 | — | — |
| None | — | — | — | — | — | 0 | — | — |
| GREEN_YELLOW | — | — | — | — | — | — | 1 | — |
| None | — | — | — | — | — | — | 0 | — |
| GREEN | — | — | — | — | — | — | — | 1 |
| None | — | — | — | — | — | — | — | 0 |

In some aspects, an output register (illustrated in TABLE 14) may be configured to contain the data bit for the selected output status.

In some aspects, the following Read and Write commands may be used in connection with the output register: Read @ 0x6D, and Write @ 0x2D.

TABLE 14

| Output Register FUNCTION | BIT NUMBER | | | | | | | |
|---|---|---|---|---|---|---|---|---|
| | 7 | 6 | 5 | 4 | 3 | 2 | 1 | 0 |
| WET_COIL_OUTPUT | 1 | — | — | — | — | — | — | — |
| None | 0 | — | — | — | — | — | — | — |
| DRY_COIL_OUTPUT | — | 1 | — | — | — | — | — | — |
| None | — | 0 | — | — | — | — | — | — |
| TXD | — | — | 1 | — | — | — | — | — |
| None | — | — | 0 | — | — | — | — | — |
| Reserved | — | — | — | 1 | — | — | — | — |
| None | — | — | — | 0 | — | — | — | — |
| Reserved | — | — | — | — | 1 | — | — | — |
| None | — | — | — | — | 0 | — | — | — |
| SIGNAL_INDICATOR_OUTPUT2 | — | — | — | — | — | 1 | — | — |
| None | — | — | — | — | — | 0 | — | — |
| SIGNAL_INDICATOR_OUTPUT1 | — | — | — | — | — | — | 1 | — |
| None | — | — | — | — | — | — | 0 | — |
| Reserved | — | — | — | — | — | — | — | 1 |
| None | — | — | — | — | — | — | — | 0 |

In some aspects, a state register (illustrated in TABLE 15) may be configured to contain the data array pointers for the selected state information.

In some aspects, the following Read and Write commands may be used in connection with the state register: Read @ 0x6E, and Write @ 0x2E.

TABLE 15

| State Register FUNCTION | BIT NUMBER | | | | | | | |
|---|---|---|---|---|---|---|---|---|
| | 7 | 6 | 5 | 4 | 3 | 2 | 1 | 0 |
| WET_COIL_ON | 1 | — | — | — | — | — | — | — |
| None | 0 | — | — | — | — | — | — | — |
| WET_COIL_OPN | — | 1 | — | — | — | — | — | — |
| None | — | 0 | — | — | — | — | — | — |
| WET_COIL_OFF | — | — | 1 | — | — | — | — | — |
| None | — | — | 0 | — | — | — | — | — |
| DRY_COIL_ON | — | — | — | 1 | — | — | — | — |
| None | — | — | — | 0 | — | — | — | — |
| DRY_COIL_OPN | — | — | — | — | 1 | — | — | — |
| None | — | — | — | — | 0 | — | — | — |
| DRY_COIL_OFF | — | — | — | — | — | 1 | — | — |
| None | — | — | — | — | — | 0 | — | — |
| DRIVER_INPUT_ON | — | — | — | — | — | — | 1 | — |
| None | — | — | — | — | — | — | 0 | — |
| DRIVER_INPUT_OFF | — | — | — | — | — | — | — | 1 |
| None | — | — | — | — | — | — | — | 0 |

In some aspects, a statistics register (illustrated in TABLE 16) may be configured to contain the data array pointers for the selected statistics information.

In some aspects, the following Read and Write commands may be used in connection with the statistics register: Read @ 0x6F; and Write @ 0x2F.

TABLE 16

| Statistics Register FUNCTION | BIT NUMBER | | | | | | | |
|---|---|---|---|---|---|---|---|---|
| | 7 | 6 | 5 | 4 | 3 | 2 | 1 | 0 |
| STATUS | 1 | — | — | — | — | — | — | — |
| None | 0 | — | — | — | — | — | — | — |
| STATE | — | 1 | — | — | — | — | — | — |
| None | — | 0 | — | — | — | — | — | — |
| MODE | — | — | 1 | — | — | — | — | — |
| None | — | — | 0 | — | — | — | — | — |
| FAULT | — | — | — | 1 | — | — | — | — |
| None | — | — | — | 0 | — | — | — | — |
| OUTPUT | — | — | — | — | 1 | — | — | — |
| None | — | — | — | — | 0 | — | — | — |
| INPUT | — | — | — | — | — | 1 | — | — |
| None | — | — | — | — | — | 0 | — | — |
| DRIVER | — | — | — | — | — | — | 1 | — |
| None | — | — | — | — | — | — | 0 | — |
| MODE | — | — | — | — | — | — | — | 1 |
| None | — | — | — | — | — | — | — | 0 |

In some aspects, a status register (illustrated in TABLE 17) may be configured to contain the data array pointers for the selected status information.

In some aspects, the following Read and Write commands may be used in connection with the status register: Read @ 0x70, and Write @ 0x30.

TABLE 17

| Status Register FUNCTION | BIT NUMBER | | | | | | | |
|---|---|---|---|---|---|---|---|---|
| | 7 | 6 | 5 | 4 | 3 | 2 | 1 | 0 |
| CYCLE_COUNT | 1 | — | — | — | — | — | — | — |
| None | 0 | — | — | — | — | — | — | — |
| OPERATION_HALTED | — | 1 | — | — | — | — | — | — |
| None | — | 0 | — | — | — | — | — | — |
| SYSTEM_READY | — | — | 1 | — | — | — | — | — |
| None | — | — | 0 | — | — | — | — | — |
| FAILURES | — | — | — | 1 | — | — | — | — |
| None | — | — | — | 0 | — | — | — | — |
| FAILURE | — | — | — | — | 1 | — | — | — |
| None | — | — | — | — | 0 | — | — | — |
| FAULTS | — | — | — | — | — | 1 | — | — |
| None | — | — | — | — | — | 0 | — | — |
| FAULT | — | — | — | — | — | — | 1 | — |
| None | — | — | — | — | — | — | 0 | — |
| ALL_SYSTEMS_OK | — | — | — | — | — | — | — | 1 |
| None | — | — | — | — | — | — | — | 0 |

In some aspects, a version register (illustrated in TABLE 18) may be configured to contain the data array pointers for the version information.

In some aspects, the following Read and Write commands may be used in connection with the version register: Read @ 0x71, and Write @ 0x31.

TABLE 18

Version Register — BIT NUMBER

| FUNCTION | 7 | 6 | 5 | 4 | 3 | 2 | 1 | 0 |
|---|---|---|---|---|---|---|---|---|
| PCB_REVISION | 1 | — | — | — | — | — | — | — |
| None | 0 | — | — | — | — | — | — | — |
| ASSEMBLY_REVISION | — | 1 | — | — | — | — | — | — |
| None | — | 0 | — | — | — | — | — | — |
| DATE_CODE | — | — | 1 | — | — | — | — | — |
| None | — | — | 0 | — | — | — | — | — |
| LOT_NUMBER | — | — | — | 1 | — | — | — | — |
| None | — | — | — | 0 | — | — | — | — |
| SERIAL_NUMBER | — | — | — | — | 1 | — | — | — |
| None | — | — | — | — | 0 | — | — | — |
| HARDWARE_VERSION | — | — | — | — | — | 1 | — | — |
| None | — | — | — | — | — | 0 | — | — |
| SOFTWARE_VERSION | — | — | — | — | — | — | 1 | — |
| None | — | — | — | — | — | — | 0 | — |
| FIRMWARE_VERSION | — | — | — | — | — | — | — | 1 |
| None | — | — | — | — | — | — | — | 0 |

In some aspects, a wet delay timer register (illustrated in TABLE 19) may be configured to contain the values for the wet delay timing.

In some aspects, the following Read and Write commands may be used in connection with the wet delay timer register: Read @ 0x72, and Write @ 0x32.

TABLE 19

Wet Delay Timer Register — BIT NUMBER

| VALUE | 7 | 6 | 5 | 4 | 3 | 2 | 1 | 0 |
|---|---|---|---|---|---|---|---|---|
| Maximum: 2550 ms | 1 | 1 | 1 | 1 | 1 | 1 | 1 | 1 |
| Default: 100 ms | 0 | 0 | 0 | 0 | 1 | 0 | 1 | 0 |
| Minimum: 0 ms | 0 | 0 | 0 | 0 | 0 | 0 | 0 | 0 |

In some aspects, a switch debounce timer register (illustrated in TABLE 20) may be configured to contain the values for the switch debounce timing.

In some aspects, the following Read and Write commands may be used in connection with the switch debounce timer register: Read @ 0x73, and Write @0x33.

TABLE 20

Switch Debounce Timer Register — BIT NUMBER

| VALUE | 7 | 6 | 5 | 4 | 3 | 2 | 1 | 0 |
|---|---|---|---|---|---|---|---|---|
| Maximum: 2550 ms | 1 | 1 | 1 | 1 | 1 | 1 | 1 | 1 |
| Default: 100 ms | 0 | 0 | 0 | 0 | 1 | 0 | 1 | 0 |
| Minimum: 0 ms | 0 | 0 | 0 | 0 | 0 | 0 | 0 | 0 |

In some aspects, a receive data timer register (illustrated in TABLE 21) may be configured to contain the values for the receive data timing.

In some aspects, the following Read and Write commands may be used in connection with the receive data timer mode register: Read @ 0x74, and Write@0x34.

TABLE 21

Receive Data Timer Register — BIT NUMBER

| VALUE | 7 | 6 | 5 | 4 | 3 | 2 | 1 | 0 |
|---|---|---|---|---|---|---|---|---|
| Maximum: 2550 ms | 1 | 1 | 1 | 1 | 1 | 1 | 1 | 1 |
| Default: 100 ms | 0 | 0 | 0 | 0 | 1 | 0 | 1 | 0 |
| Minimum: 0 ms | 0 | 0 | 0 | 0 | 0 | 0 | 0 | 0 |

In some aspects, a transmit data timer register (illustrated in TABLE 22) may be configured to contain the values for the transmit data timing.

In some aspects, the following Read and Write commands may be used in connection with the transmit data timer register: Read @ 0x75, and Write @0x35.

TABLE 22

Transmit Data Timer Register — BIT NUMBER

| VALUE | 7 | 6 | 5 | 4 | 3 | 2 | 1 | 0 |
|---|---|---|---|---|---|---|---|---|
| Maximum: 2550 ms | 1 | 1 | 1 | 1 | 1 | 1 | 1 | 1 |
| Default: 100 ms | 0 | 0 | 0 | 0 | 1 | 0 | 1 | 0 |
| Minimum: 0 ms | 0 | 0 | 0 | 0 | 0 | 0 | 0 | 0 |

In some aspects, a wet coil output timer register (illustrated in TABLE 23) may be configured to contain the values for the wet coil output timing.

In some aspects, the following Read and Write commands may be used in connection with the wet coil output timer register: Read @ 0x76, and Write @0x36.

TABLE 23

Wet Coil Output Timer Register — BIT NUMBER

| VALUE | 7 | 6 | 5 | 4 | 3 | 2 | 1 | 0 |
|---|---|---|---|---|---|---|---|---|
| Maximum: 2550 ms | 1 | 1 | 1 | 1 | 1 | 1 | 1 | 1 |
| Default: 100 ms | 0 | 0 | 0 | 0 | 1 | 0 | 1 | 0 |
| Minimum: 0 ms | 0 | 0 | 0 | 0 | 0 | 0 | 0 | 0 |

In some aspects, a wet current input timer register (illustrated in TABLE 24) may be configured to contain the values for the wet current input timing.

In some aspects, the following Read and Write commands may be used in connection with the wet current input timer register: Read @ 0x77, and Write @0x37.

TABLE 24

Wet Current Input Timer Register — BIT NUMBER

| VALUE | 7 | 6 | 5 | 4 | 3 | 2 | 1 | 0 |
|---|---|---|---|---|---|---|---|---|
| Maximum: 2550 ms | 1 | 1 | 1 | 1 | 1 | 1 | 1 | 1 |
| Default: 100 ms | 0 | 0 | 0 | 0 | 1 | 0 | 1 | 0 |
| Minimum: 0 ms | 0 | 0 | 0 | 0 | 0 | 0 | 0 | 0 |

In some aspects, a dry coil output timer register (illustrated in TABLE 25) may be configured to contain the values for the dry coil output timing.

In some aspects, the following Read and Write commands may be used in connection with the dry coil output timer register: Read @ 0x78, and Write @0x38.

TABLE 25

| Dry Coil Output Timer Register | BIT NUMBER | | | | | | | |
|---|---|---|---|---|---|---|---|---|
| VALUE | 7 | 6 | 5 | 4 | 3 | 2 | 1 | 0 |
| Maximum: 2550 ms | 1 | 1 | 1 | 1 | 1 | 1 | 1 | 1 |
| Default: 100 ms | 0 | 0 | 0 | 0 | 1 | 0 | 1 | 0 |
| Minimum: 0 ms | 0 | 0 | 0 | 0 | 0 | 0 | 0 | 0 |

In some aspects, a dry current input timer register (illustrated in TABLE 26) may be configured to contain the values for the dry current input timing.

In some aspects, the following Read and Write commands may be used in connection with the dry current input timer register: Read @ 0x79, and Write @0x39.

TABLE 26

| Dry Current Input Timer Register | BIT NUMBER | | | | | | | |
|---|---|---|---|---|---|---|---|---|
| VALUE | 7 | 6 | 5 | 4 | 3 | 2 | 1 | 0 |
| Maximum: 2550 ms | 1 | 1 | 1 | 1 | 1 | 1 | 1 | 1 |
| Default: 100 ms | 0 | 0 | 0 | 0 | 1 | 0 | 1 | 0 |
| Minimum: 0 ms | 0 | 0 | 0 | 0 | 0 | 0 | 0 | 0 |

In some aspects, a signal indicator output timer register (illustrated in TABLE 27) may be configured to contain the values for the signal indicator output timing.

In some aspects, the following Read and Write commands may be used in connection with the signal indicator output timer register: Read @ 0x7A, and Write @ 0x3A.

TABLE 27

| Signal Indicator Output Timer Register | BIT NUMBER | | | | | | | |
|---|---|---|---|---|---|---|---|---|
| VALUE | 7 | 6 | 5 | 4 | 3 | 2 | 1 | 0 |
| Maximum: 2550 ms | 1 | 1 | 1 | 1 | 1 | 1 | 1 | 1 |
| Default: 100 ms | 0 | 0 | 0 | 0 | 1 | 0 | 1 | 0 |
| Minimum: 0 ms | 0 | 0 | 0 | 0 | 0 | 0 | 0 | 0 |

Figure 4:
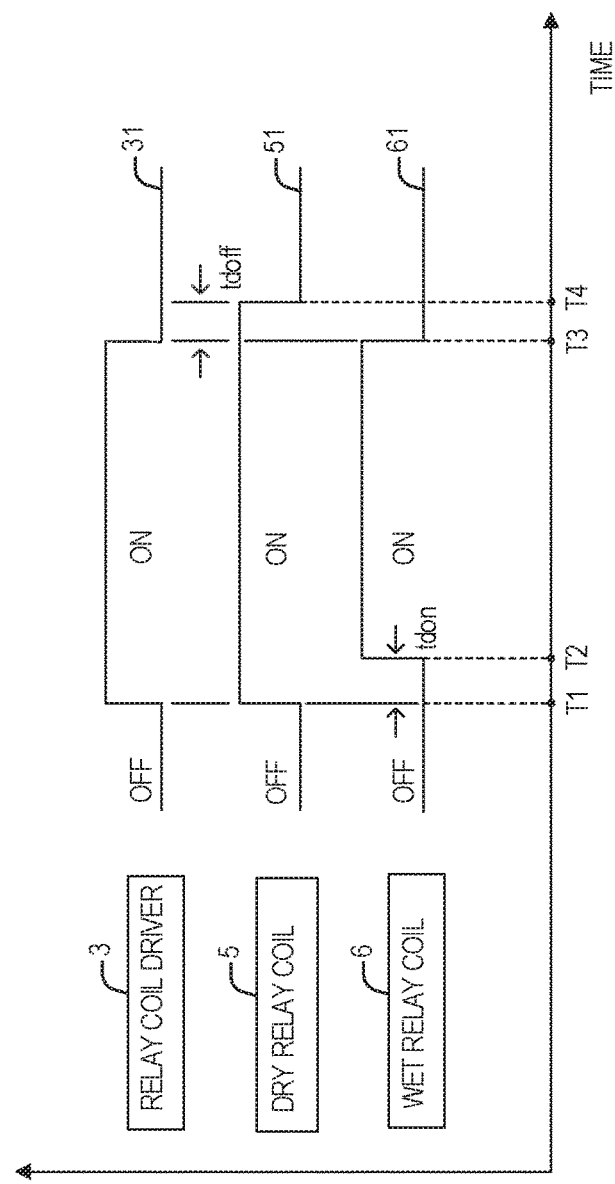
FIG. 4 depicts a timing diagram for sequencing dry and wet relay coils using the example wet/dry contact sequencer of FIG. 2, according to some embodiments.

FIG. 4 depicts a timing diagram for sequencing dry and wet relay coils using the example wet/dry contact sequencer of FIG. 2, according to some embodiments.

In some aspects, the controller 18 may configure one or more timers (e.g., in connection with sequencing the wet and dry contacts). Example timer labels and definitions of different timers that may be configured by controller 18 include the following:

In some aspects, a coil driver input timer may be used to delay the processing for the logic state of the coil driver input signal: COIL_DRIVER_INPUT_TIMER is the label when the timer is running.

In some aspects, a switch debounce timer may be used to delay the processing for the logic state of the switch input signal: SWITCH_DEBOUNCE_TIMER is the label when the timer is running.

In some aspects, a receive data timer may be used to delay the processing for the logic state of the receive data input signal: RECEIVE_DATA_TIMER is the label when the timer is running.

In some aspects, a transmit data timer may be used to delay the processing for the logic state of the transmit data output signal: TRANSMIT_DATA_TIMER is the label when the timer is running.

In some aspects, a wet coil output timer may be used to delay the processing for the logic state of the wet coil output signal: WET_COIL_OUTPUT_TIMER is the label when the timer is running.

In some aspects, a wet current input timer may be used to delay the processing for the logic state of the wet current input signal: WET_CURRENT_INPUT_TIMER is the label when the timer is running.

In some aspects, a dry coil output timer may be used to delay the processing for the logic state of the dry coil output signal: DRY_COIL_OUTPUT_TIMER is the label when the timer is running.

In some aspects, a dry current input timer may be used to delay the processing for the logic state of the dry current input signal: DRY_CURRENT_INPUT_TIMER is the label when the timer is running.

In some aspects, a signal indicator output 1 timer may be used to delay the processing for the logic state of the signal indicator output 1 signal: SIGNAL_INDICATOR_OUTPUT_TIMER is the label when the timer 1 is running.

In some aspects, a signal indicator output 2 timer may be used to delay the processing for the logic state of the signal indicator output 2 signal: SIGNAL_INDICATOR_OUTPUT_TIMER is the label when the timer 2 is running.

In some aspects, the following wet/dry sequencing algorithm in TABLE 28 may be used by the wet/dry contact sequencer 1 to sequence the wet and dry contacts:

TABLE 28

REM wet/dry sequencing routine
REM de-energized conditions
REM COIL_DRIVER_INPUT is high
REM WET_COIL_OUTPUT is low
REM DRY_COIL_OUTPUT is low
REM all input signals may be debounced
START
IF
FALLING_EDGE_COIL_DRIVER_INPUT
THEN SET DRY_COIL_OUTPUT HIGH
AND START WET_COIL_OUTPUT_TIMER
WHEN
WET_COIL_OUTPUT_TIMER EXPIRES
THEN SET
WET_COIL_OUTPUT HIGH
REM energized conditions
REM COIL_DRIVER_INPUT is low
REM WET_COIL_OUTPUT is high
REM DRY_COIL_OUTPUT is high
WAIT
IF
RISING_EDGE_COIL_DRIVER_INPUT
THEN SET WET_COIL_OUTPUT LOW
AND START
DRY_COIL_OUTPUT_TIMER
WHEN
DRY_COIL_OUTPUT_TIMER EXPIRES
THEN SET
DRY_COIL OUTPUT LOW
RETURN TO START The above sequencing algorithm is also illustrated in connection with the timing diagram 400 in FIG. 4. More specifically, timing diagram 400 illustrates output signal levels associated with the relay coil driver 3, the dry relay coil 5, and the wet relay coil 6. When the relay coil driver is ON (i.e., relay coil driver voltage is present at time T1), which results in the COIL_DRIVER_INPUT being pulled to low (or having a falling edge), the dry relay coil output is also activated at time T1 (i.e., the dry contact is energized and makes a connection). A wet coil output timer is then activated and at time T2 (after time delay tdon), the wet relay coil output is activated (i.e., the wet contact is energized and makes a connection).

When the relay coil driver is OFF (i.e., relay coil driver voltage is not present and is turned off at time T3), which results in the COIL_DRIVER_INPUT being pulled to high (or having a rising edge), the wet relay coil output is also deactivated at time T3 (i.e., the wet relay is de-energized and breaks the connection). A dry coil output timer is then activated and at time T4 (after time delay tdoff), the dry relay coil output is deactivated (i.e., the dry relay is de-energized and breaks the connection).

In some aspects, the following wet/dry coil fault detection algorithm in TABLE 29 may be used by the wet/dry contact sequencer 1 to detect faults in the wet or dry coils:

TABLE 29

REM wet/dry coil fault detection routine
REM de-energized conditions
REM COIL_DRIVER_INPUT is high
REM WET_COIL_OUTPUT is low
REM DRY_COIL_OUTPUT is low
REM all input signals may be debounced
START
IF
DRY_COIL_OUTPUT HIGH
AND AFTER
DRY_COIL_INPUT_TIMER
DRY_COIL_INPUT EQUALS HIGH
THEN SET
DRY_COIL_FAULT BIT HIGH
NEXT
WAIT FOR
DRY_COIL_FAULT_CLEAR COMMAND
OR
ALL_FAULT_CLEAR COMMAND
AND
IF
WET_COIL_OUTPUT HIGH
AND AFTER
WET_COIL_INPUT_TIMER
WET_COIL_INPUT EQUALS HIGH
THEN SET
WET_COIL_FAULT BIT HIGH
NEXT
WAIT FOR
WET_COIL_FAULT_CLEAR COMMAND
OR
ALL_FAULT_CLEAR COMMAND
RETURN TO START In the above algorithm. DRY_COIL_INPUT being HIGH indicates an absence of dry coil current (which may be detected via the dry coil current sensor 113). When DRY_COIL_OUTPUT is HIGH (indicating energization of the dry coil) and after DRY_COIL_INPUT_TIMER runs out and no dry coil current is detected, a dry coil fault is declared (e.g., DRY_COIL_FAULT bit is high).

Similarly, WET_COIL_INPUT being HIGH indicates an absence of wet coil current (which may be detected via the wet coil current sensor 114). When WET_COIL_OUTPUT is HIGH (indicating energization of the wet coil) and after WET_COIL_INPUT_TIMER runs out and no wet coil current is detected, a wet coil fault is declared (e.g., WET_COIL_FAULT bit is high). The faults may be sustained until a CLEAR command is received and processed by the controller 18.

Even though TABLE 28 illustrates a specific wet/dry sequencing technique and TABLE 29 illustrates a specific wet/dry fault detection technique, the disclosure is not limited in this regard and other sequencing or fault detection techniques may be used by the wet/dry contact sequencer 1.

Figure 5:
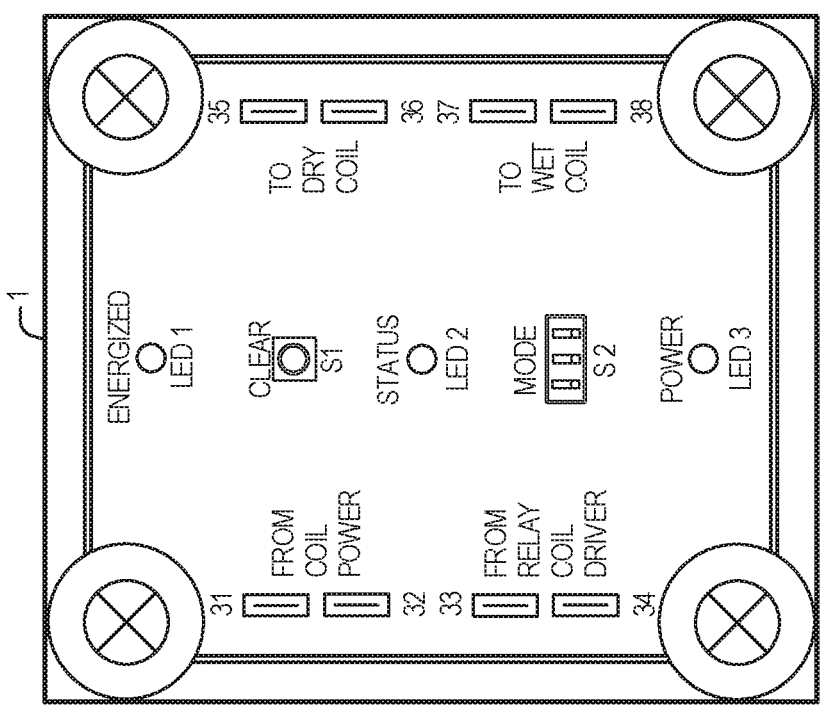
FIG. 5 depicts a packaging example of a wet/dry contact sequencer, according to some embodiments.

FIG. 5 depicts a packaging example of the wet/dry contact sequencer 1, according to some embodiments.

Figure 6:
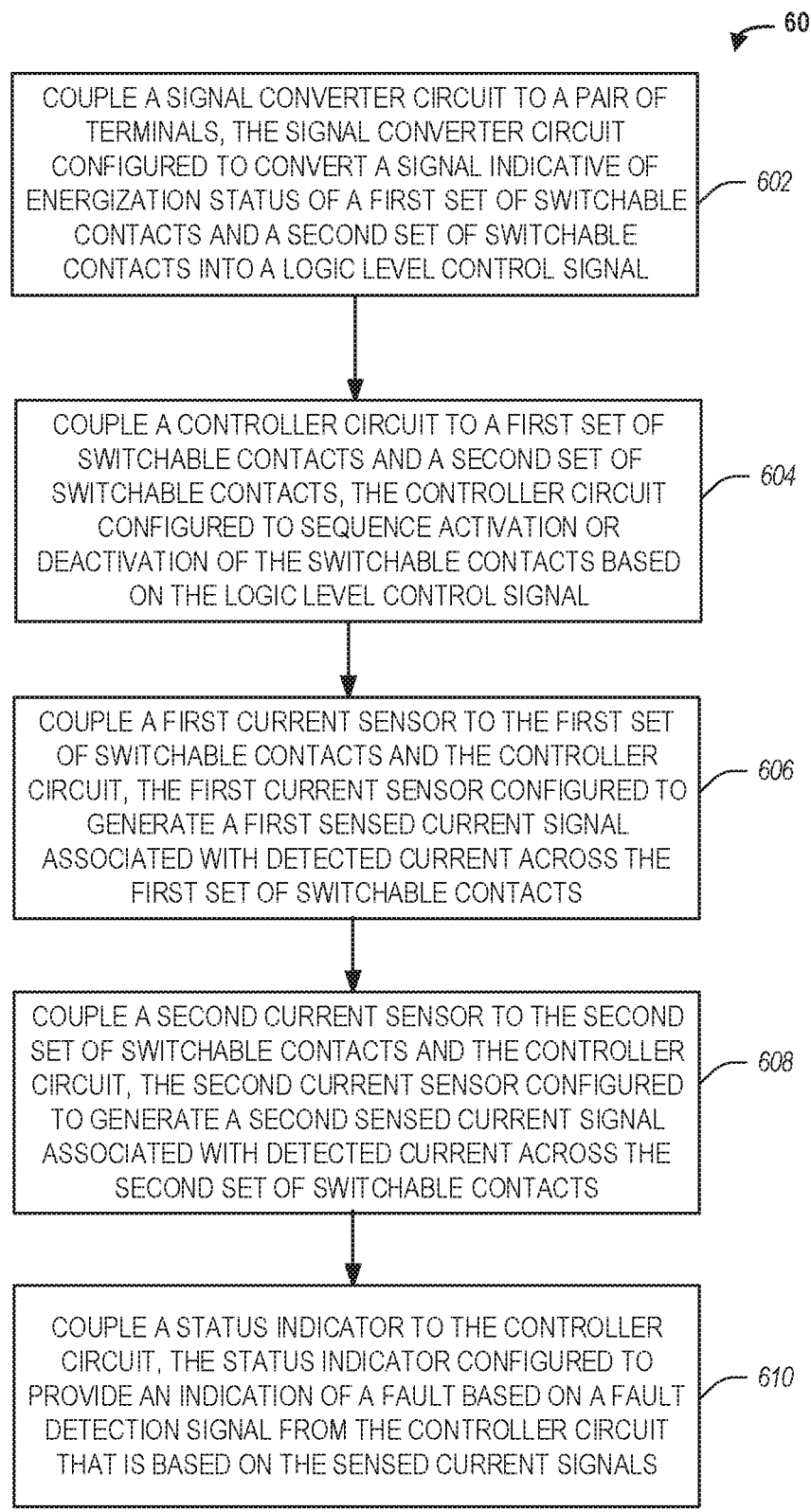
FIG. 6 is a flowchart of a method for detecting a fault during a wet/dry contact sequencer operation, according to some embodiments.

FIG. 6 is a flowchart of a method 600 for detecting a fault during a wet/dry contact sequencer operation, according to some embodiments. At operation 602, a signal converter circuit (e.g., 16) may be coupled to a pair of terminals (e.g., 13). The signal converter circuit may be configured to convert a signal indicative of energization status of a first set of switchable contacts and a second set of switchable contacts into a logic level control signal (e.g., the CDI signal), the signal received from a driver circuit (e.g., 3) via the pair of terminals (e.g., 13).

At operation 604, a controller circuit (e.g., 18) may be coupled to a first set of switchable contacts (e.g., the contacts of the dry relay 5) and a second set of switchable contacts (e.g., the contacts of the wet relay 6). The controller circuit may be configured to sequence activation or deactivation of the first set of switchable contacts and the second set of switchable contacts based on the logic level control signal. For example, activation or deactivation of the contacts may be sequenced based on the algorithm in TABLE 28 as well as the timing diagram in FIG. 4.

At operation 606, a first current sensor (e.g., 113) may be coupled to the first set of switchable contacts and the controller circuit (e.g., 18). The first current sensor may be configured to generate a first sensed current signal associated with detected current across the first set of switchable contacts.

At operation 608, a second current sensor (e.g., 114) may be coupled to the second set of switchable contacts and the controller circuit. The second current sensor may be configured to generate a second sensed current signal associated with detected current across the second set of switchable contacts.

At operation 610, a status indicator (e.g., 110) may be coupled to the controller circuit. The status indicator may be configured to provide an indication of a fault based on a fault detection signal from the controller circuit. For example, fault detection may be performed in connection with the fault detection algorithm in TABLE 29 to detect a fault with the wet and/or dry relays. The fault detection signal may be generated based on the first sensed current signal and the second sensed current signal (e.g., a fault may be detected based on whether or not the wet or dry coil are activated via the driver signal, and whether or not current is sensed at the wet or dry coil).

Additional Examples

The description of the various embodiments is merely exemplary in nature and, thus, variations that do not depart from the gist of the examples and detailed description herein are intended to be within the scope of the present disclosure. Such variations are not to be regarded as a departure from the spirit and scope of the present disclosure.

Example 1 is an electrical circuit, comprising: a first pair of terminals adapted to be connected across a first set of switchable contacts; a second pair of terminals adapted to be connected across a second set of switchable contacts, the second set of switchable contacts coupled to an arc suppression circuit; a controller circuit operatively coupled to the first and second pair of terminals, the controller circuit configured to sequence activation or deactivation of the first set of switchable contacts and the second set of switchable contacts based on a contact control signal, wherein during the activation, the first set of switchable contacts is activated prior to activation of the second set of switchable contacts, and during the deactivation, the second set of switchable contacts is deactivated prior to deactivation of the first set of switchable contacts; and a first power switching circuit operatively coupled to the first pair of terminals and the controller circuit, the first power switching circuit configured to switch power from an external power source and to trigger the activation or the deactivation of the first set of switchable contacts based on a first logic state signal from the controller circuit.

In Example 2, the subject matter of Example 1 includes, wherein the first power switching circuit supplies power to the first pair of terminals to trigger the activation of the first set of switchable contacts when the first logic state signal from the controller circuit comprises a logic high state.

In Example 3, the subject matter of Example 2 includes, wherein the first power switching circuit disconnects power to the first pair of terminals to trigger the deactivation of the first set of switchable contacts when the first logic state signal from the controller circuit comprises a logic low state.

In Example 4, the subject matter of Examples 1-3 includes a second power switching circuit operatively coupled to the second pair of terminals and the controller circuit, the second power switching circuit configured to switch power from the external power source and to trigger the activation or the deactivation of the second set of switchable contacts based on a second logic state signal from the controller circuit.

In Example 5, the subject matter of Example 4 includes, wherein the second power switching circuit supplies power to the second pair of terminals to trigger the activation of the second set of switchable contacts when the second logic state signal from the controller circuit comprises a logic high state.

In Example 6, the subject matter of Example 5 includes, wherein the second power switching circuit disconnects power to the second pair of terminals to trigger the deactivation of the second set of switchable contacts when the second logic state signal from the controller circuit comprises a logic low state.

In Example 7, the subject matter of Examples 4-6 includes, wherein the controller circuit is configured to configure the first logic state signal to trigger the activation of the first set of switchable contacts when the contact control signal indicates an energized state for the first and second set of switchable contacts and the first and second set of switchable contacts are unpowered; initiate a first timer based on the activation of the first set of switchable contacts; and configure the second logic state signal to trigger the activation of the second set of switchable contacts, when the first timer expires.

In Example 8, the subject matter of Example 7 includes, wherein the controller circuit is to: configure the second logic state signal to trigger the deactivation of the first set of switchable contacts when the contact control signal indicates a de-energized state for the first and second set of switchable contacts and the first and second set of switchable contacts are powered via the external power source; initiate a second timer based on the deactivation of the second set of switchable contacts; and configure the first logic state signal to trigger the deactivation of the first set of switchable contacts, when the second timer expires.

In Example 9, the subject matter of Examples 1-8 includes, wherein the first set of switchable contacts are configured to break or make a first connection under no current, and the second set of switchable contacts are configured to break or make a second connection under current.

In Example 10, the subject matter of Examples 1-9 includes, wherein the first set of switchable contacts comprises a first relay coil and first relay contacts, and the second set of switchable contacts comprises a second relay coil and second relay contacts, the second relay contacts coupled to an arc suppressor.

In Example 11, the subject matter of Examples 1-10 includes, wherein the contact control signal is a logic level control signal, and the electrical circuit further comprises: a signal converter circuit configured to convert a signal indicative of energization status of the first set of switchable contacts and the second set of switchable contacts into the logic level control signal.

In Example 12, the subject matter of Example 11 includes, wherein the signal converter circuit comprises a plurality of current limiting elements coupled to a bridge rectifier.

In Example 13, the subject matter of Examples 1-12 includes, a first current sensor operatively coupled to the first pair of terminals, the first current sensor configured to generate a first sensed current signal associated with detected current across the first set of switchable contacts; and a second current sensor operatively coupled to the second pair of terminals, the second current sensor configured to generate a second sensed current signal associated with detected current across the second set of switchable contacts.

In Example 14, the subject matter of Example 13 includes, wherein the first sensed current signal is indicative of a magnitude of the detected current across the first set of switchable contacts, and the second sensed current signal is indicative of a magnitude of the detected current across the second set of switchable contacts.

In Example 15, the subject matter of Examples 13-14 includes, wherein the first sensed current signal is indicative of presence or absence of current across the first set of switchable contacts, and the second sensed current signal is indicative of presence or absence of current across the second set of switchable contacts.

In Example 16, the subject matter of Examples 13-15 includes, wherein the first current sensor comprises a first reverse polarity protection element coupled to a first solid state relay, and wherein the first solid state relay is configured to output the first sensed current signal.

In Example 17, the subject matter of Example 16 includes, wherein the second current sensor comprises a second reverse polarity protection element coupled to a second solid state relay, and wherein the second solid state relay is configured to output the second sensed current signal.

In Example 18, the subject matter of Examples 13-17 includes, wherein the controller circuit is configured to detect a fault in one or both of the first set of switchable contacts and the second set of switchable contacts based on the first sensed current signal and the second sensed current signal.

In Example 19, the subject matter of Example 18 includes, a status indicator coupled to the controller circuit, the status indicator configured to provide an indication of the detected fault.

In Example 20, the subject matter of Examples 18-19 includes, wherein the controller circuit is configured to detect the fault in the first set of switchable contacts when the first logic state signal from the controller circuit indicates the first set of switchable contacts is activated and the first sensed current signal indicates an absence of current across the first set of switchable contacts.

In Example 21, the subject matter of Examples 13-20 includes, a first power failure bypass circuit coupled to a power supply of the controller circuit and the first pair of terminals, the first power failure bypass circuit configured to activate or deactivate the first set of switchable contacts using the contact control signal, based on detecting failure of the power supply.

In Example 22, the subject matter of Example 21 includes, a second power failure bypass circuit coupled to a power supply of the controller circuit and the second pair of terminals, the second power failure bypass circuit configured to activate or deactivate the second set of switchable contacts using the contact control signal, based on detecting the failure of the power supply.

Example 23 is a system, comprising: a first relay circuit comprising a first relay coil and a first set of switchable contacts; a second relay circuit comprising a second relay coil and a second set of switchable contacts; an arc suppression circuit coupled to the second set of switchable contacts; a coil driver termination circuit configured to receive a signal indicative of energization status of the first set of switchable contacts and the second set of switchable contacts; and a controller circuit operatively coupled to the coil driver termination circuit, the first relay circuit, and the second relay circuit, wherein the controller circuit is configured to sequence activation or deactivation of the first set of switchable contacts and the second set of switchable contacts based on the signal indicative of energization status, and wherein the controller circuit is configured to sequence the activation or the deactivation while the second set of switchable contacts is protected by the are suppression circuit.

In Example 24, the subject matter of Example 23 includes a first power switching circuit operatively coupled to the first set of switchable contacts and the controller circuit, the first power switching circuit configured to switch power from an external power source and to trigger the activation or the deactivation of the first set of switchable contacts based on the signal indicative of energization status.

In Example 25, the subject matter of Example 24 includes a second power switching circuit operatively coupled to the second set of switchable contacts and the controller circuit, the second power switching circuit configured to switch power from the external power source and to trigger the activation or the deactivation of the second set of switchable contacts based on the signal indicative of energization status.

In Example 26, the subject matter of Examples 23-25 includes, wherein the contact control signal is a logic level control signal, and the electrical circuit further comprises: a signal converter circuit configured to convert the signal indicative of energization status of the first set of switchable contacts and the second set of switchable contacts into a logic level control signal for communication to the control circuit.

In Example 27, the subject matter of Example 26 includes, wherein the control circuit is configured to during an activation sequence based on the logic level control signal, activate the first set of switchable contacts prior to activation of the second set of switchable contacts, and during a deactivation sequence based on the logic level control signal, deactivate the second set of switchable contacts prior to deactivation of the first set of switchable contacts.

In Example 28, the subject matter of Examples 26-27 includes, wherein the signal converter circuit comprises a plurality of current limiting elements coupled to a bridge rectifier.

Example 29 is a method, comprising: coupling a signal converter circuit to a pair of terminals, the signal converter circuit configured to convert a signal indicative of energization status of a first set of switchable contacts and a second set of switchable contacts into a logic level control signal, the signal received from a driver circuit via the pair of terminals; coupling a controller circuit to a first set of switchable contacts and a second set of switchable contacts, the controller circuit configured to sequence activation or deactivation of the first set of switchable contacts and the second set of switchable contacts based on the logic level control signal; coupling a first current sensor to the first pair of terminals and the controller circuit, the first current sensor configured to generate a first sensed current signal associated with detected current across the first set of switchable contacts; coupling a second current sensor to the second pair of terminals and the controller circuit, the second current sensor configured to generate a second sensed current signal associated with detected current across the second set of switchable contacts; and coupling a status indicator to the controller circuit, the status indicator configured to provide an indication of a fault based on a fault detection signal from the controller circuit, the fault detection signal generated based on the first sensed current signal and the second sensed current signal.

In Example 30, the subject matter of Example 29 includes, coupling an arc suppression circuit in parallel with the second set of switchable contacts.

In Example 31, the subject matter of Examples 29-30 includes, wherein the first sensed current signal is indicative of a magnitude of the detected current across the first set of switchable contacts, and the second sensed current signal is indicative of a magnitude of the detected current across the second set of switchable contacts.

In Example 32, the subject matter of Examples 29-31 includes, wherein the first sensed current signal is indicative of presence or absence of current across the first set of switchable contacts, and the second sensed current signal is indicative of presence or absence of current across the second set of switchable contacts.

In Example 33, the subject matter of Examples 29-32 includes, wherein the controller circuit is configured to detect the fault in the first set of switchable contacts when the logic level control signal indicates the first set of switchable contacts is activated and the first sensed current signal indicates an absence of current across the first set of switchable contacts.

In Example 34, the subject matter of Examples 29-33 includes, wherein the controller circuit is configured to detect the fault in the second set of switchable contacts when the logic level control signal indicates the second set of switchable contacts is activated and the second sensed current signal indicates an absence of current across the second set of switchable contacts.

In Example 35, the subject matter of Examples 29-34 includes, wherein the controller circuit is configured to detect the fault in the first set of switchable contacts when the logic level control signal indicates the first set of switchable contacts is deactivated and the first sensed current signal indicates a presence of current across the first set of switchable contacts.

In Example 36, the subject matter of Examples 29-35 includes, wherein the controller circuit is configured to detect the fault in the second set of switchable contacts when the logic level control signal indicates the second set of switchable contacts is deactivated and the second sensed current signal indicates a presence of current across the second set of switchable contacts.

Example 37 is at least one machine-readable medium including instructions that, when executed by processing circuitry, cause the processing circuitry to perform operations to implement of any of Examples 1-36.

Example 38 is an apparatus comprising means to implement of any of Examples 1-36.

Example 39 is a system to implement of any of Examples 1-36.

Example 40 is a method to implement of any of Examples 1-36.

The above detailed description includes references to the accompanying drawings, which form a part of the detailed description. The drawings show, by way of illustration, specific embodiments. These embodiments are also referred to herein as "examples." Such examples may include elements in addition to those shown and described. However, the present inventor also contemplates examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc, are used merely as labels, and are not intended to impose numerical requirements on their objects.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the scope disclosed herein.

The above description is intended to be, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. In addition, in the above Detailed Description, various features may be grouped together to streamline the disclosure. This should not be interpreted as intending that an unclaimed disclosed feature is essential to any claim. Rather, the inventive subject matter may lie in less than all features of a particular disclosed embodiment. Thus, the following claims are hereby incorporated into the Detailed Description, with each claim standing on its own as a separate embodiment.

What is claimed is:

1. A contact sequencer circuit, comprising:
   a dry contact with a first pair of switchable electrodes, the dry contact configured to cycle through a make state and a break state without conducting current;
   a wet contact with a second pair of switchable electrodes, the wet contact operatively coupled in series with the dry contact and configured to cycle through the make state and the break state while conducting current; and
   an arc suppressor operatively coupled across the second pair of switchable electrodes of the wet contact;
   wherein during an activation sequence of the contact sequencer circuit, the first pair of switchable electrodes is activated prior to activating the second pair of switchable electrodes, and during a deactivation sequence of the contact sequencer circuit, the second pair of switchable electrodes is deactivated prior to deactivating the first pair of switchable electrodes, and
   wherein the arc suppressor comprises a contact separation detector circuit and a contact bypass circuit coupled across the second pair of switchable electrodes of the wet contact.

2. The contact sequencer circuit of claim 1, wherein the arc suppressor is configured to extinguish a first arc formed across the second pair of switchable electrodes during the make state of the wet contact.

3. The contact sequencer circuit of claim 1, wherein the arc suppressor is configured to extinguish a second arc formed across the second pair of switchable electrodes during the break state of the wet contact.

4. The contact sequencer circuit of claim 1, further comprising:
   a coil driver termination circuit configured to receive a signal indicative of energization status of the dry contact and the wet contact.

5. The contact sequencer circuit of claim 4, further comprising:
   a signal converter circuit operatively coupled to the coil driver termination circuit, the signal converter circuit configured to convert the signal indicative of the energization status into a logic level control signal.

6. The contact sequencer circuit of claim 5, further comprising:
   a controller circuit operatively coupled to the dry contact and the wet contact, the controller circuit configured to receive the logic level control signal.

7. The contact sequencer circuit of claim 6, wherein the controller circuit is configured to:
   perform the activation sequence or the deactivation sequence of the contact sequencer circuit based on the logic level control signal.

8. The contact sequencer circuit of claim 6, wherein the logic level control signal comprises a first logic state signal, and the contact sequencer circuit further comprises:

a first power switching circuit operatively coupled to the first pair of switchable electrodes and the controller circuit, the first power switching circuit configured to switch power from an external power source and to trigger activation or deactivation of the first pair of switchable electrodes based on the first logic state signal.

9. The contact sequencer circuit of claim 8, wherein the first power switching circuit supplies power to the first pair of switchable electrodes to trigger the activation of the first pair of switchable electrodes when the first logic state signal comprises a logic high state.

10. The contact sequencer circuit of claim 9, wherein the first power switching circuit disconnects power to the first pair of switchable electrodes to trigger the deactivation of the first pair of switchable electrodes when the first logic state signal comprises a logic low state.

11. The contact sequencer circuit of claim 8, wherein the logic level control signal comprises a second logic state signal, and the contact sequencer circuit further comprises:
a second power switching circuit operatively coupled to the second pair of switchable electrodes and the controller circuit, the second power switching circuit configured to switch power from the external power source and to trigger activation or deactivation of the second pair of switchable electrodes based on the second logic state signal.

12. The contact sequencer circuit of claim 11, wherein the second power switching circuit supplies power to the second pair of switchable electrodes to trigger the activation of the second pair of switchable electrodes when the second logic state signal comprises a logic high state.

13. The contact sequencer circuit of claim 12, wherein the second power switching circuit disconnects power to the second pair of switchable electrodes to trigger the deactivation of the second pair of switchable electrodes when second first logic state signal comprises a logic low state.

14. A contact sequencer circuit, comprising:
a first contact with a first pair of switchable electrodes, the first contact configured to carry load current when in a closed state, and cycle through a make state and a break state without carrying the load current;
a second contact with a second pair of switchable electrodes, the second contact operatively coupled in series with the first contact and configured to cycle through the make state and the break state while carrying the load current; and
an arc suppressor operatively coupled across the second pair of switchable electrodes and configured to extinguish at least one arc formed across the second pair of switchable electrodes during the make state or the break state;
wherein during an activation sequence of the contact sequencer circuit, the first pair of switchable electrodes is activated prior to activating the second pair of switchable electrodes, and during a deactivation sequence of the contact sequencer circuit, the second pair of switchable electrodes is deactivated prior to deactivating the first pair of switchable electrodes, and
wherein the arc suppressor comprises a contact separation detector circuit and a contact bypass circuit coupled across the second pair of switchable electrodes of the second contact.

15. The contact sequencer circuit of claim 14, further comprising:
a controller circuit operatively coupled to the first contact and the second contact, the controller circuit configured to receive a logic level control signal corresponding to a signal indicative of energization status of the first contact and the second contact.

16. The contact sequencer circuit of claim 15, wherein the controller circuit is configured to:
perform the activation sequence or the deactivation sequence of the contact sequencer circuit based on the logic level control signal.

17. A method for sequencing contacts, the method comprising:
coupling a dry contact with a first pair of switchable electrodes of a contact sequencer circuit in series with a wet contact with a second pair of switchable electrodes of the contact sequencer circuit, the dry contact configured to cycle through a make state and a break state without conducting current, and the wet contact configured to cycle through the make state and the break state while conducting current;
coupling an arc suppressor across the second pair of switchable electrodes of the wet contact;
receiving a signal indicative of energization status of the dry contact and the wet contact from a driver circuit coupled to the contact sequencer circuit via a pair of terminals;
converting the signal indicative of the energization status into a logic level control signal; and
performing an activation sequence or a deactivation sequence of the contact sequencer circuit based on the logic level control signal.

18. The method of claim 17, wherein performing the activation sequence comprises:
activating the first pair of switchable electrodes prior to activating the second pair of switchable electrodes.

19. The method of claim 17, wherein performing the deactivation sequence comprises:
deactivating the second pair of switchable electrodes prior to deactivating the first pair of switchable electrodes.

20. The method of claim 17, further comprising:
coupling a controller circuit to the first pair of switchable electrodes and the second pair of switchable electrodes, the controller circuit configured to perform the activation sequence or the deactivation sequence of the contact sequencer circuit based on the logic level control signal.

* * * * *